United States Patent
Zamir

(10) Patent No.: US 9,984,583 B2
(45) Date of Patent: May 29, 2018

(54) AUDIO DEMONSTRATION KIT

(71) Applicant: Bose Corporation, Framingham, MA (US)

(72) Inventor: Lee Zamir, Cambridge, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days. days.

(21) Appl. No.: 14/229,628

(22) Filed: Mar. 28, 2014

(65) Prior Publication Data

US 2015/0086044 A1 Mar. 26, 2015

Related U.S. Application Data

(60) Provisional application No. 61/880,663, filed on Sep. 20, 2013.

(51) Int. Cl.
*G09B 5/02* (2006.01)
*H03F 3/181* (2006.01)
(Continued)

(52) U.S. Cl.
CPC .............. *G09B 5/02* (2013.01); *G06N 99/005* (2013.01); *G09B 1/325* (2013.01); *G09B 5/04* (2013.01);
(Continued)

(58) Field of Classification Search
CPC ..... H03F 3/181; H03F 2200/03; H04R 1/028; G09B 5/00; G09B 5/06; G09B 1/325;
(Continued)

(56) References Cited

U.S. PATENT DOCUMENTS 1,451,612 A  4/1923  Hausner
2,946,254 A  7/1960  Hauser
(Continued)

FOREIGN PATENT DOCUMENTS

GB  2323697 A  3/1997
WO  2008033579 A2  3/2008

OTHER PUBLICATIONS

"Berlin Boombox—About," Berlin Boombox, <https://web.archive.org/web/20121121235425/http://berlinboombox.com/about>, Dec. 9, 2015, 4 pages.
(Continued)

*Primary Examiner* — Jason R Kurr
(74) *Attorney, Agent, or Firm* — Patterson + Sheridan, LLP

(57) ABSTRACT

An audio demonstration kit encourages understanding of audio concepts by enabling children to construct and study speaker performance. In a particular embodiment, the audio demonstration kit includes a paper speaker and instructions. The paper speaker includes a backplate, a suspension, and a diaphragm cut from a single sheet of paper. The demonstration kit may feature an amplifier that is configurable to accommodate various hardware additions as a child is ready for more progressively challenging construction. For example, the amplifier of an embodiment allows single and dual mode operation, as well as drives a rotary motor and is coordinated with a strobe light. The amplifier of an embodiment is synchronized with the strobe light and a moveable platform to create the impression of that jiggling figures attached to the table are dancing. Interfaces with smart phone, recording, and other technologies further enhances and encourages the learning experience.

20 Claims, 20 Drawing Sheets

(51) Int. Cl.
*G09B 23/14* (2006.01)
*G09B 5/04* (2006.01)
*G06N 99/00* (2010.01)
*G09B 1/32* (2006.01)
*H04R 1/02* (2006.01)
*H04R 5/02* (2006.01)

(52) U.S. Cl.
CPC ............ *G09B 23/14* (2013.01); *H03F 3/181* (2013.01); *H04R 1/021* (2013.01); *H03F 2200/03* (2013.01); *H04R 1/028* (2013.01); *H04R 5/02* (2013.01); *H04R 2201/029* (2013.01)

(58) Field of Classification Search
CPC ...... G09B 23/14; G09B 23/18; G09B 23/181; G09B 23/182
USPC ................. 381/120, 119, 123; 434/308–321
See application file for complete search history.

(56) References Cited

U.S. PATENT DOCUMENTS

| | | | |
|---|---|---|---|
| 3,447,249 A | 6/1969 | Greger | |
| 3,726,025 A * | 4/1973 | Salem | G09B 23/14 40/428 |
| 3,940,576 A * | 2/1976 | Schultz | H04R 7/12 181/163 |
| 3,996,457 A | 12/1976 | Gabriel | |
| 4,057,313 A | 11/1977 | Polizzano | |
| 4,217,702 A | 8/1980 | Bennett | |
| 4,547,043 A | 10/1985 | Penz | |
| 4,600,355 A | 7/1986 | Johnson | |
| 4,790,714 A | 12/1988 | Schnapp | |
| 4,879,526 A * | 11/1989 | Botti | H03F 3/72 330/295 |
| 4,936,185 A | 6/1990 | Yamaguchi et al. | |
| 4,952,036 A | 8/1990 | Gulick et al. | |
| 5,090,934 A | 2/1992 | Quercetti | |
| 5,154,615 A | 10/1992 | Joubert | |
| 5,179,459 A | 1/1993 | Plesinger | |
| 5,360,344 A | 11/1994 | Rishack | |
| 5,742,486 A | 4/1998 | Yangkuai | |
| 5,801,946 A | 9/1998 | Nissen et al. | |
| 5,857,986 A * | 1/1999 | Moriyasu | A61H 23/02 273/148 B |
| 6,135,776 A | 10/2000 | Erturk et al. | |
| 6,317,111 B1 | 11/2001 | Nito et al. | |
| 6,513,624 B2 | 2/2003 | Coffin | |
| 6,802,755 B2 | 10/2004 | Walker et al. | |
| 7,128,634 B2 | 10/2006 | Ogihara | |
| 7,144,255 B2 | 12/2006 | Seymour | |
| 7,611,357 B2 | 11/2009 | Han et al. | |
| 8,081,781 B2 * | 12/2011 | Watanabe | H03F 3/181 381/11 |
| 8,139,783 B2 | 3/2012 | Schuster et al. | |
| 8,155,350 B2 * | 4/2012 | Suyama | H04R 27/00 381/119 |
| 8,319,701 B2 | 11/2012 | Ikeno et al. | |
| 9,078,065 B2 * | 7/2015 | Karam | H04R 3/12 |
| 2002/0114487 A1 * | 8/2002 | Maekawa | H04R 9/063 381/412 |
| 2002/0159610 A1 | 10/2002 | Bank et al. | |
| 2003/0031330 A1 * | 2/2003 | Kim | H04R 1/028 381/111 |
| 2003/0213642 A1 | 11/2003 | Powell | |
| 2004/0140345 A1 | 7/2004 | Kao | |
| 2005/0280550 A1 | 12/2005 | Kurian et al. | |
| 2009/0003619 A1 | 1/2009 | Solow | |
| 2009/0034780 A1 * | 2/2009 | Gaudreault | H04R 9/063 381/424 |
| 2010/0226617 A1 | 9/2010 | Piccionelli et al. | |
| 2011/0226545 A1 | 9/2011 | Richardson et al. | |
| 2011/0228962 A1 * | 9/2011 | Taylor | G10H 1/0008 381/322 |
| 2012/0122059 A1 | 5/2012 | Schweikardt et al. | |
| 2012/0250930 A1 | 10/2012 | Kajihara et al. | |
| 2012/0300968 A1 | 11/2012 | Sun | |

OTHER PUBLICATIONS

"BOSEbuild SpeakerCraft (G2-6)," Einstein Workshop, <http://www.einsteinsworkshop.com/h3xl-school-calendar?task=view_event&event_id=247>, Aug. 30, 2013, 2 pages.
"Electromagnets," Experiments With Electromagnets, <http://web.archive.org/web/20120823044250/http://www.coolmagnetman.com/magelect.htm>, Feb. 6, 2016, 9 pages.
"Linear Voice Coil Motors," MotiCont, <http://www.pwr-con.com/voice-coil-motor.html>, Jun. 27, 2013, 26 pages.
"Make a Guitar Pickup," Instructables, <http://web.archive.org/web/20120918010648/http://www.instructables.com/id/Make-A-Guitar-Pickup/?ALLSTEPS>, Jan. 12, 2016, 14 pages.
"From Skeletons to Bridges & Other Stem Enrichment Exercises for High School Biology," The American Biology Teacher, National Association of Biology Teachers, vol. 72, Issue 1, Jan. 2010, 6 pages.
"How to Wind Your Own Audio Transformers," <http://deerlovers-site.org/transformers.html,> Apr. 4, 2016, 3 pages.
"Rotary Speaker Units," YouTube, <http://www.youtube.com/watch?v=Iw-gKyqKOrU>, Jun. 27, 2013, 2 pages.
"Paper Plate Speaker," Instructables, <https://web.archive.org/web/20100728053646/http://www.instructables.com/id/Paper-Plate-Speaker>, Dec. 9, 2015, 3 pages.
"DIY Rotary Speaker," YouTube, <http://www.youtube.com/watch?v=5xdKnkzzNLQ>, Jun. 27, 2013, 2 pages.

* cited by examiner

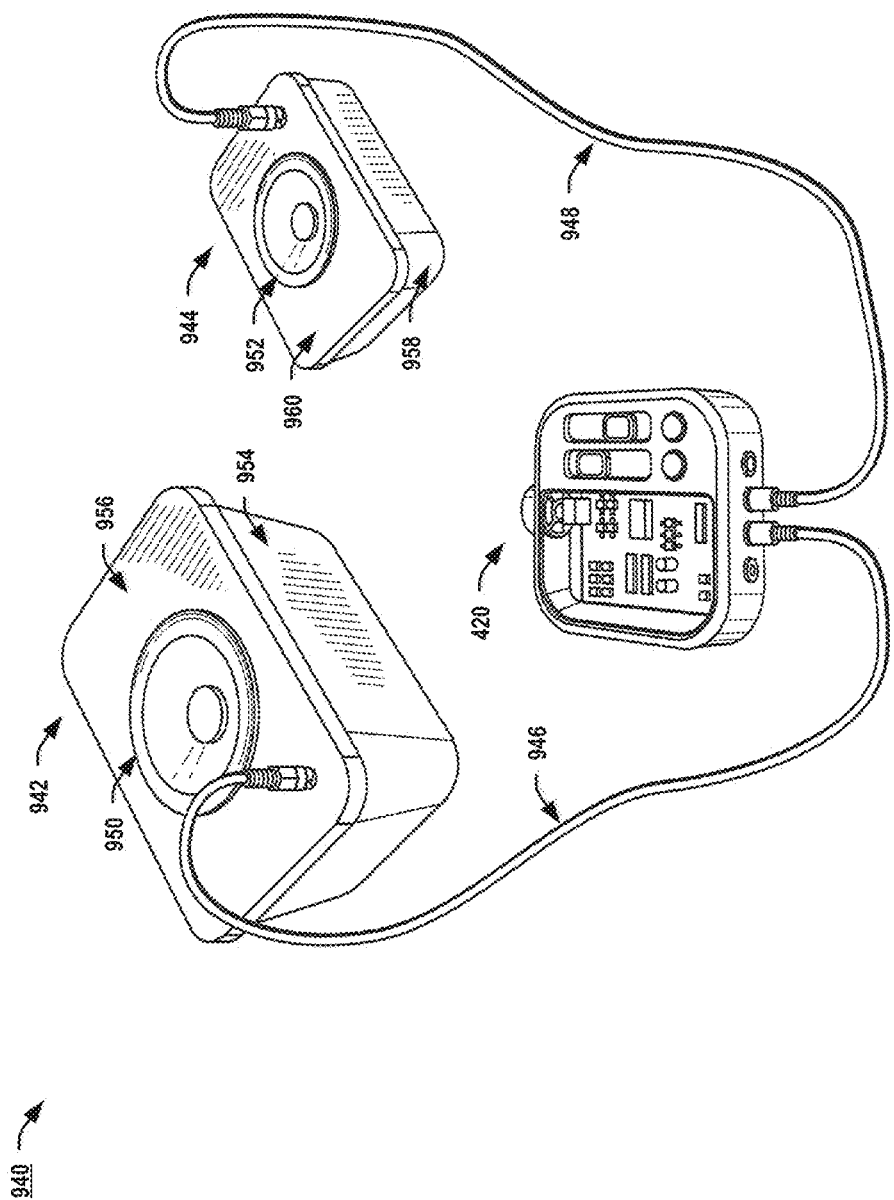

AUDIO DEMONSTRATION KIT

I. CLAIM OF PRIORITY

This application is a continuation patent application of, and claims priority from, U.S. Provisional Patent Application Ser. No. 61/880,663, filed on Sep. 20, 2013 and entitled, "Audio Demonstration Kit," which is incorporated by reference herein in its entirety for all purposes.

II. FIELD OF THE DISCLOSURE

The present disclosure relates to an audio demonstration kit and components thereof.

III. BACKGROUND

With the increase in prevalence of mobile computing devices, children are being introduced to computing technology at a younger age. For example, it is common for a child to be proficient in operating a mobile phone or a tablet computer. It is desirable to encourage children's interest and familiarity with aspects of audio, video, and communications technologies.

IV. SUMMARY OF THE DISCLOSURE

In a particular example, an audio amplifier includes a first output and a second output, a power amplifier, and a controller configured to operate the audio amplifier in a first mode and in a second mode. In the first mode, an amplified audio signal is delivered to at least one of the first output or the second output. In the second mode, current is commutated in at least one of a first coil or a second coil connected to the first output or the second output to drive at least one of a rotary motor or an oscillating element.

In another example, a method includes receiving a mode input at an audio amplifier. When the mode input indicates a first mode, an amplified audio signal is delivered to at least one of a first output or a second output of the audio amplifier. When the mode input indicates a second mode, current is communicated in at least one of a first coil or a second coil connected to the first or second output to drive at least one of a rotary motor or an oscillating element.

In another particular example, an audio demonstration kit includes an audio amplifier that includes a first output and a second output, a power amplifier, and a controller configured to operate the audio amplifier in a first mode and in a second mode. In the first mode, an amplified audio signal is delivered to at least one of the first output or the second output. In the second mode, current is commutated in at least one of a first coil or a second coil connected to the first output or the second output to drive at least one of a rotary motor or an oscillating element. A speaker kit includes at least one speaker configured to be connected to the audio amplifier.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 10 shows an embodiment of an audio demonstration kit that includes speakers that are constructed and deconstructed in a repeatable manner;

Figure 11A:
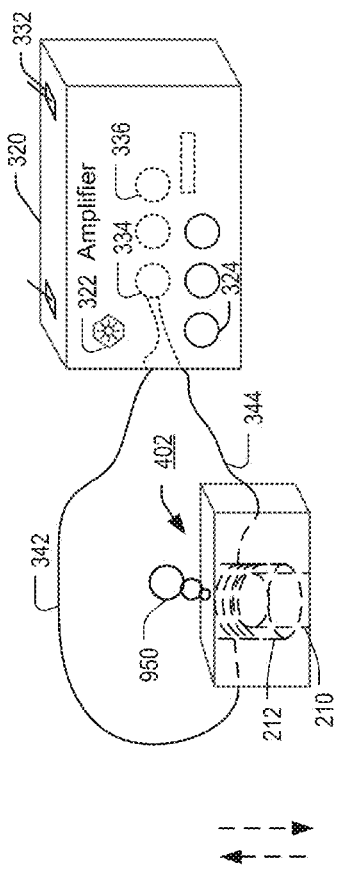
Figure 11B:
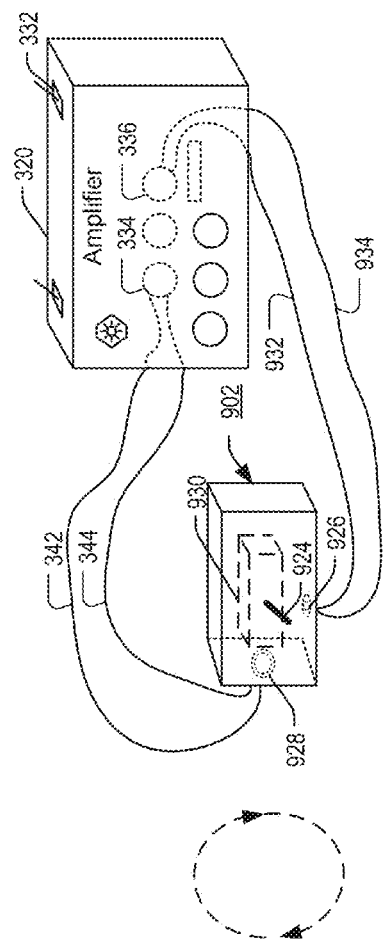
Figure 11C:
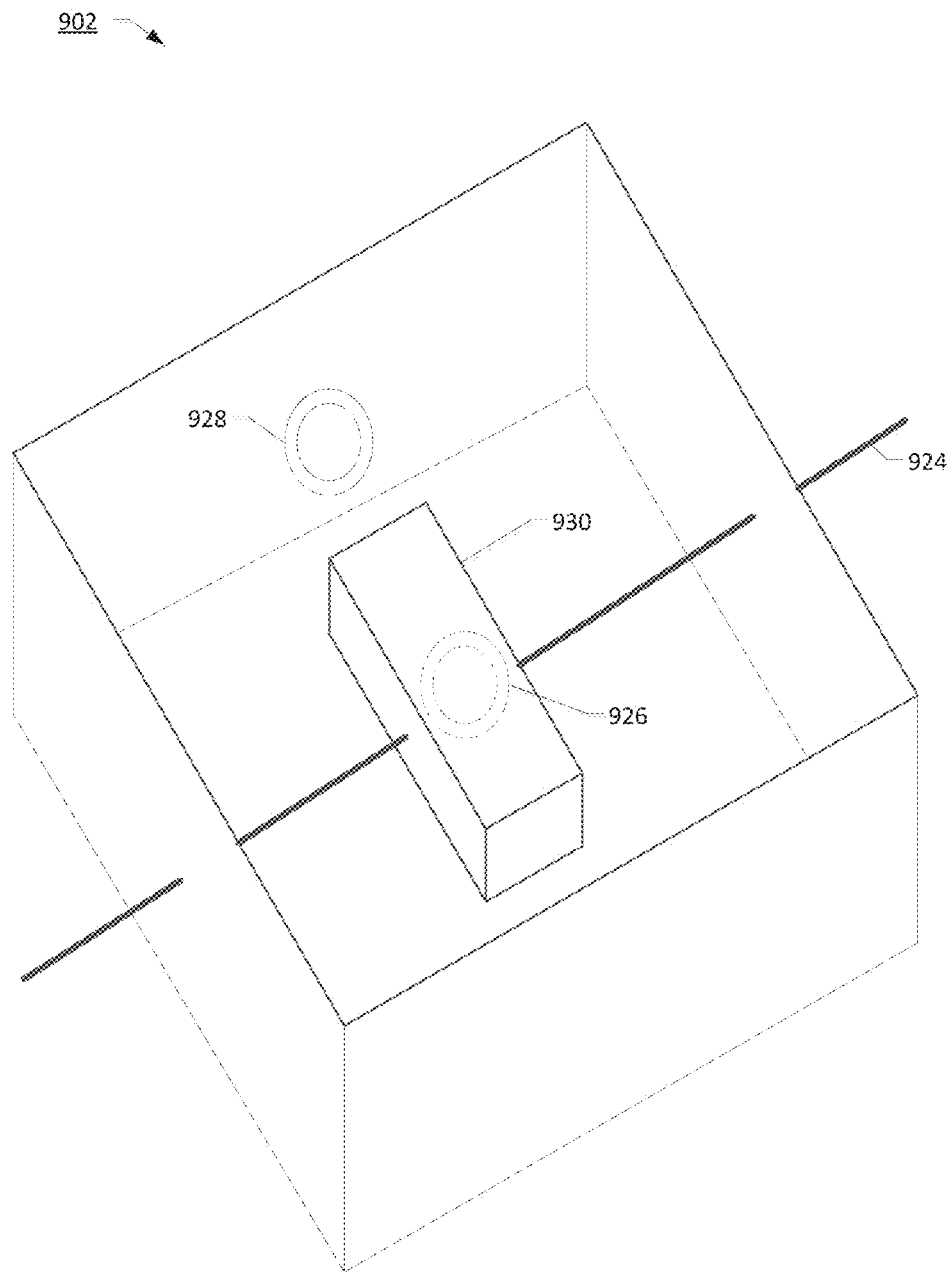
Figure 12:
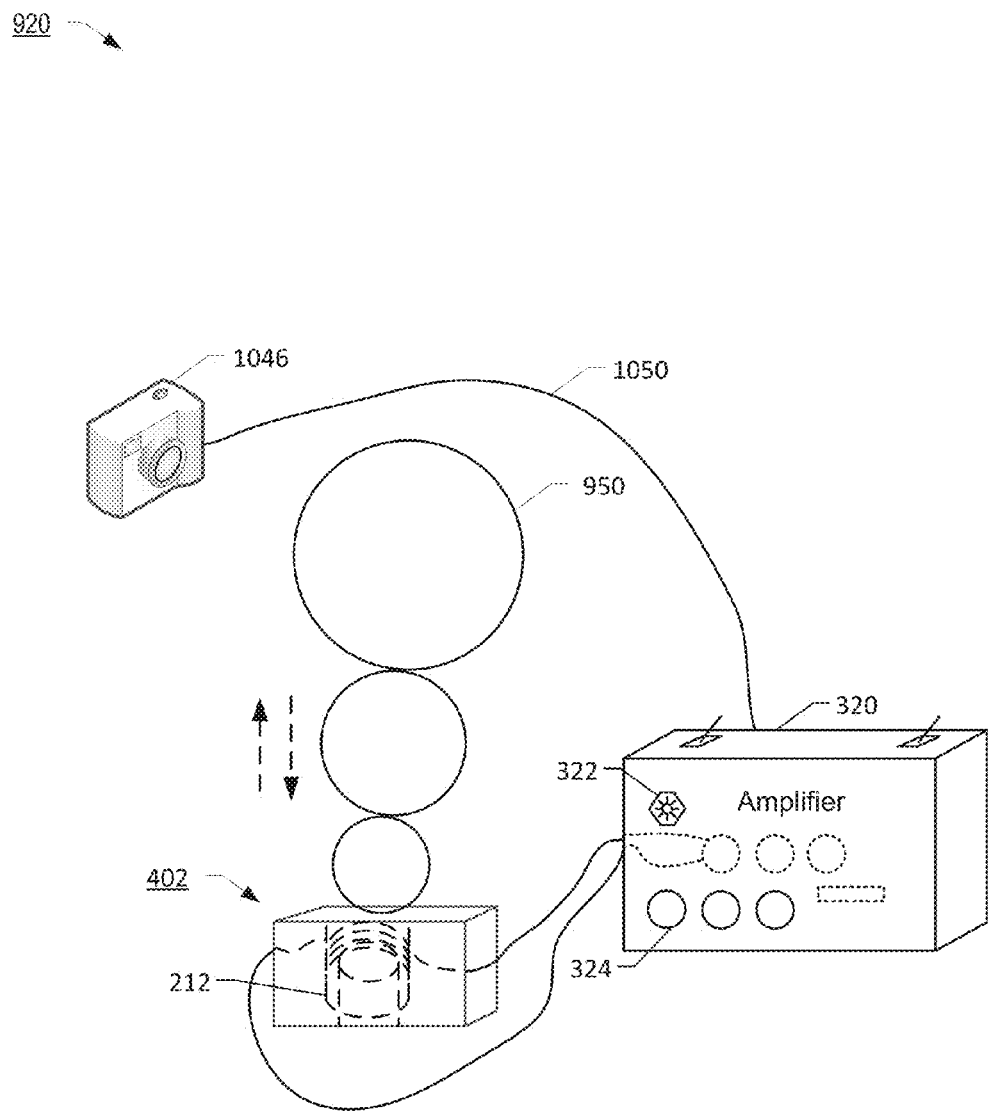
Figure 13:
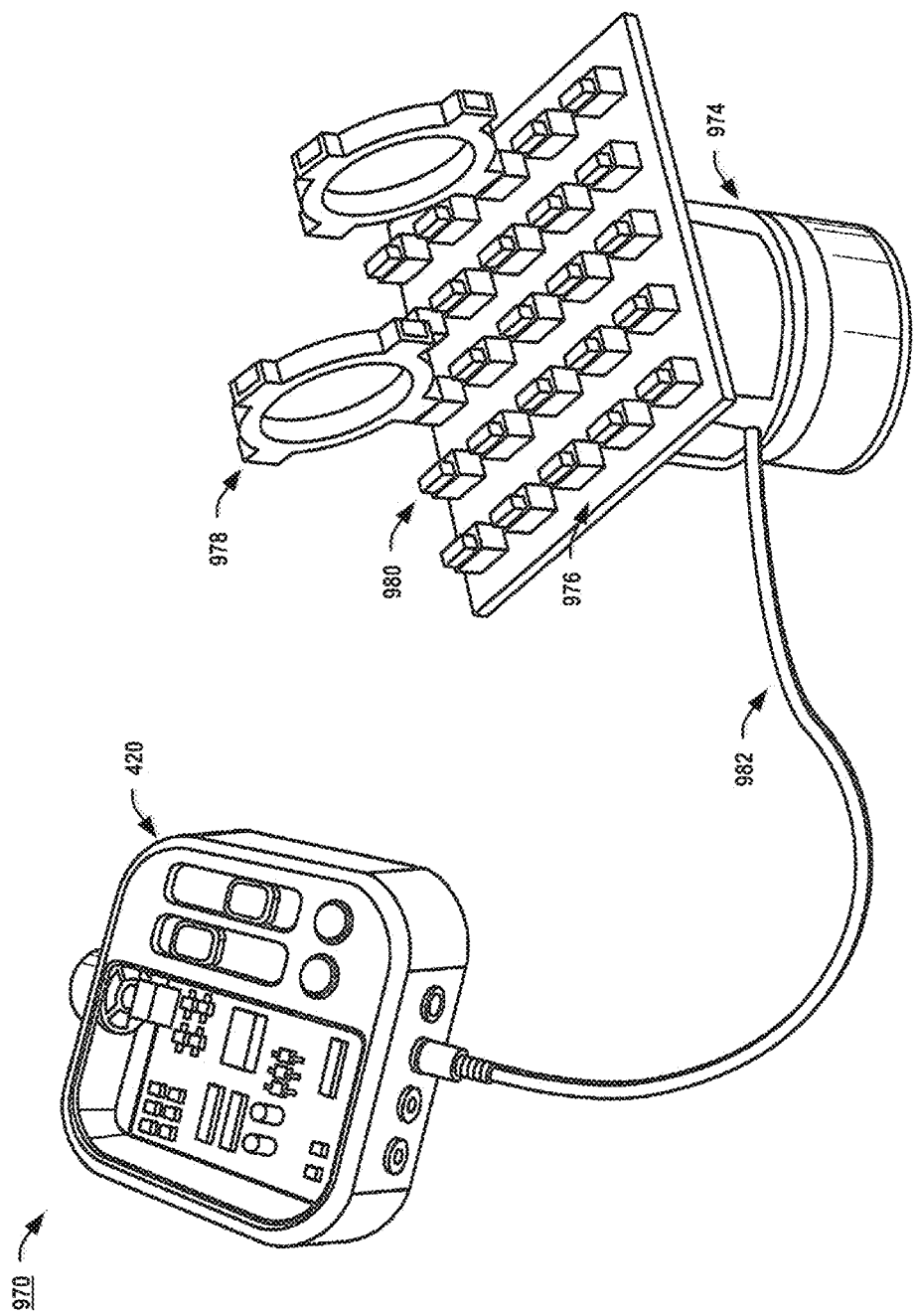

FIGS. 11A, 11B, and 11C are diagrams of illustrative embodiments of an audio demonstration kit that includes an oscillating element or a rotary motor;

FIG. 12 is a diagram of an illustrative embodiment of an audio demonstration kit that includes an oscillating element;

FIG. 13 is a perspective view of an audio demonstration kit that includes an amplifier and moveable assembly that are synchronized to a beat by a user.

Figure 14:
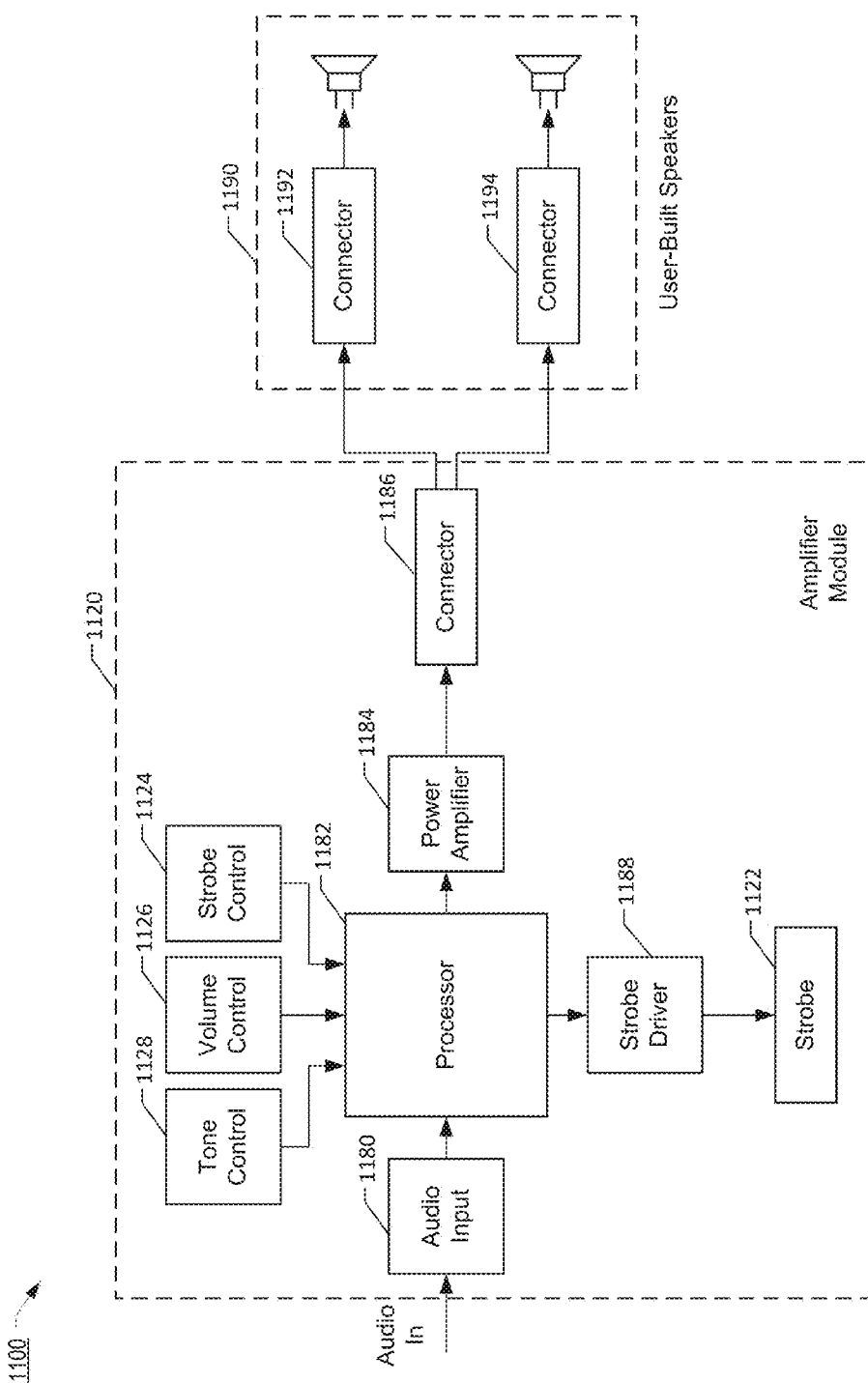
Figure 15:
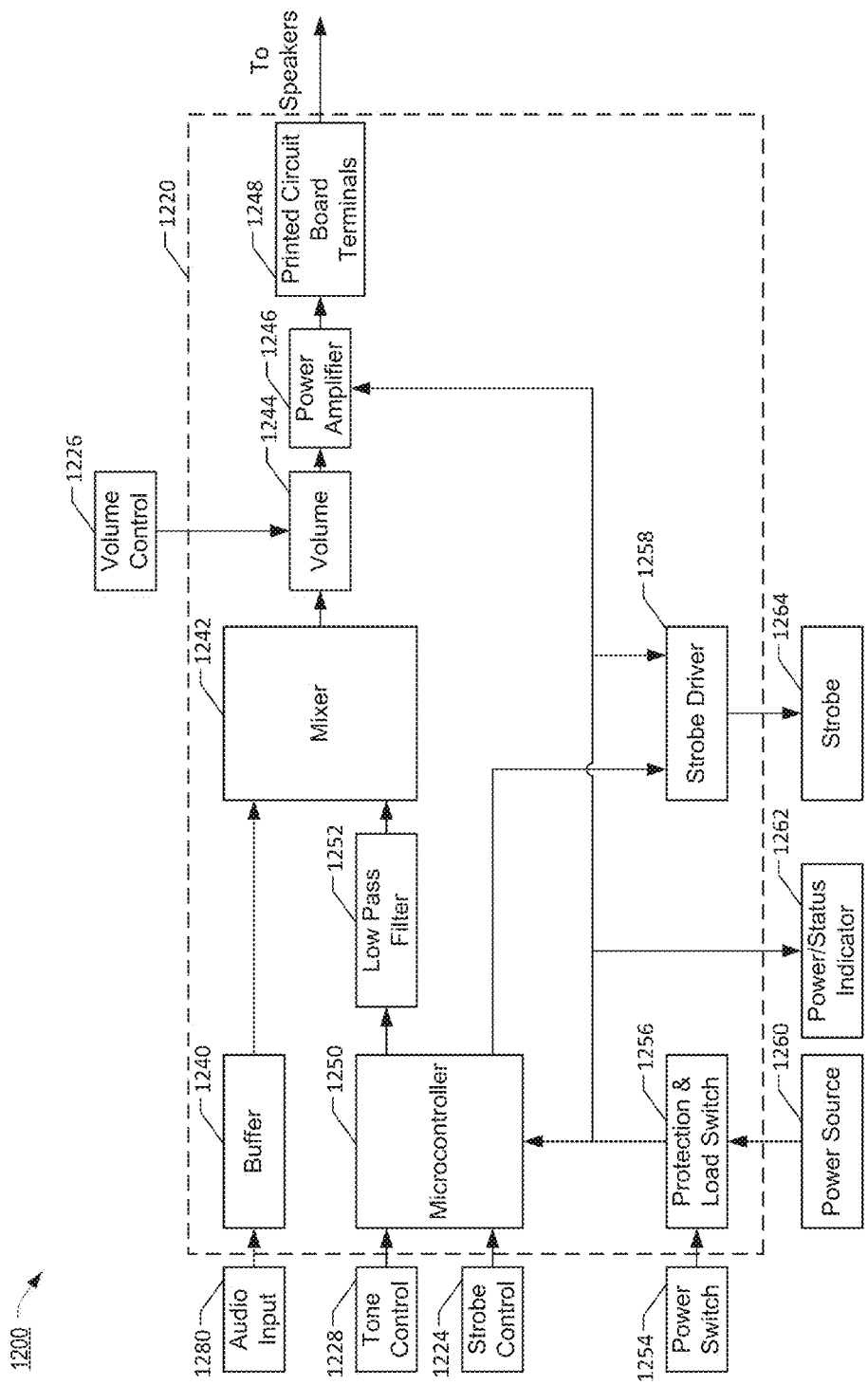
Figure 16:
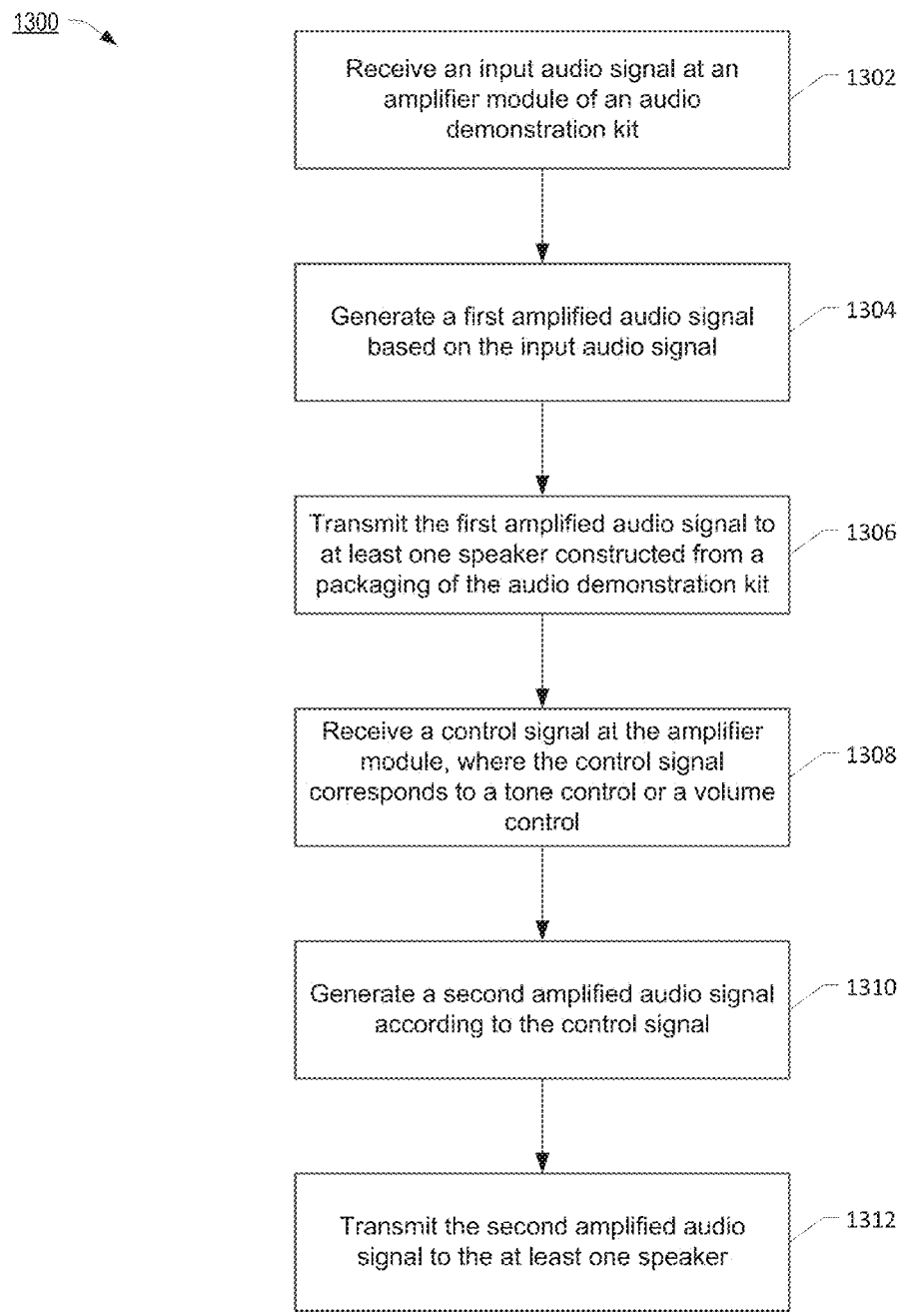
Figure 17:
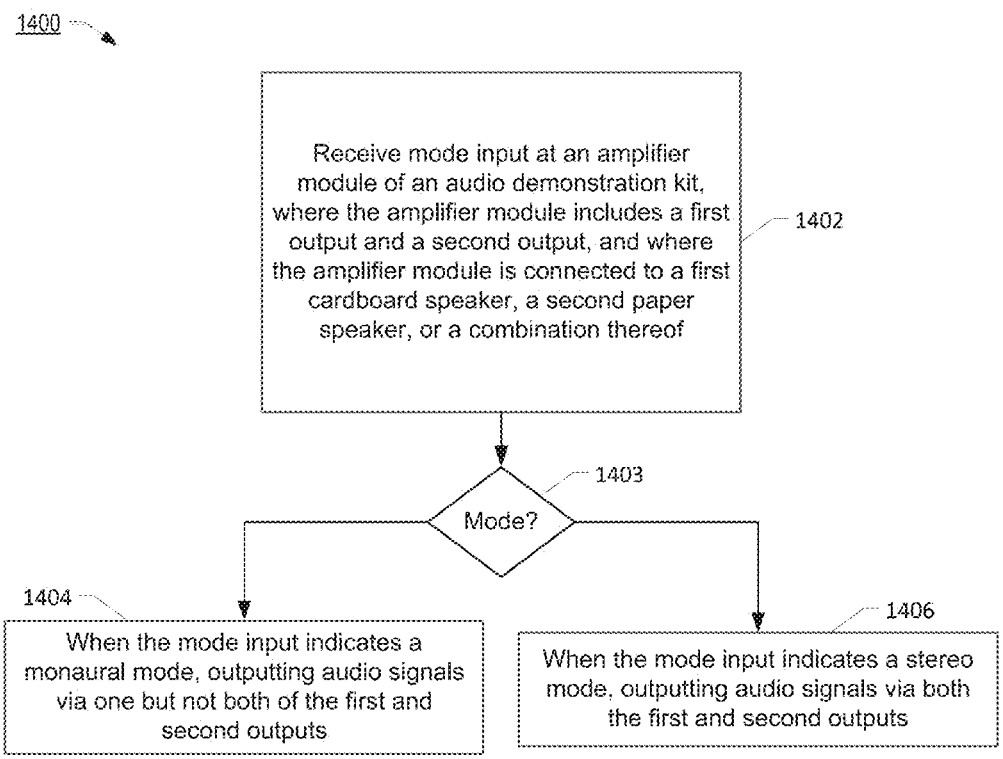
Figure 18:
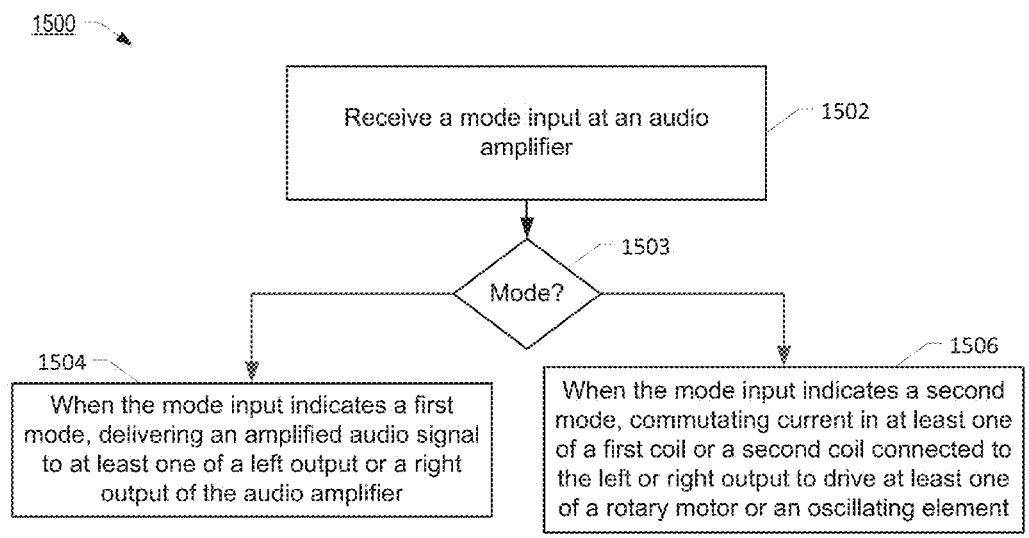
Figure 19:
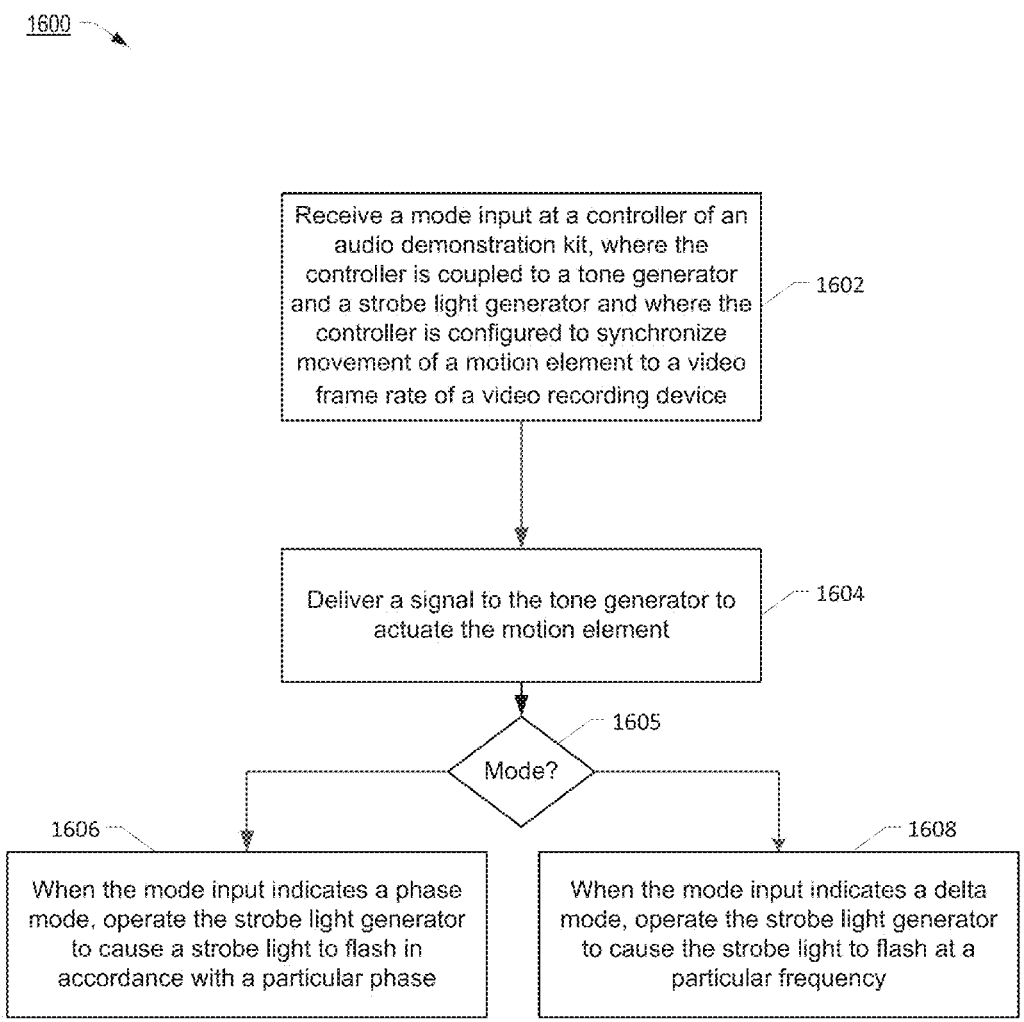

FIG. 14 is a block diagram of an illustrative embodiment of an amplifier module;

FIG. 15 is a block diagram of another illustrative embodiment of an amplifier module;

FIG. 16 is a flowchart to illustrate a particular embodiment of a method of operation of an amplifier module of an audio demonstration kit;

FIG. 17 is a flowchart to illustrate another particular embodiment of a method of operation of an amplifier module of an audio demonstration kit;

FIG. 18 is a flowchart to illustrate another particular embodiment of a method of operation of an amplifier module of an audio demonstration kit; and FIG. 19 is a flowchart to illustrate a particular embodiment of a method of actuating a motion element and synchronizing movement of the motion element to a video frame rate of a video recording device.

VI. DETAILED DESCRIPTION

An audio demonstration kit encourages understanding of audio concepts by enabling children to construct and study speaker performance. In a particular embodiment, the audio demonstration kit includes a paper speaker and instructions. The paper speaker includes a backplate, a suspension, and a diaphragm cut from a single sheet of paper. The demonstration kit may feature an amplifier that is configurable to accommodate various hardware additions as a child is ready for more progressively challenging construction. For example, the amplifier of an embodiment allows single and dual mode operation, as well as drives a rotary motor and is coordinated with a strobe light. The amplifier of an embodiment is synchronized with the strobe light and a moveable platform to create the impression of that jiggling figures attached to the table are dancing. Interfaces with smart phone, recording, and other technologies further enhances and encourages the learning experience.

Figure 1:
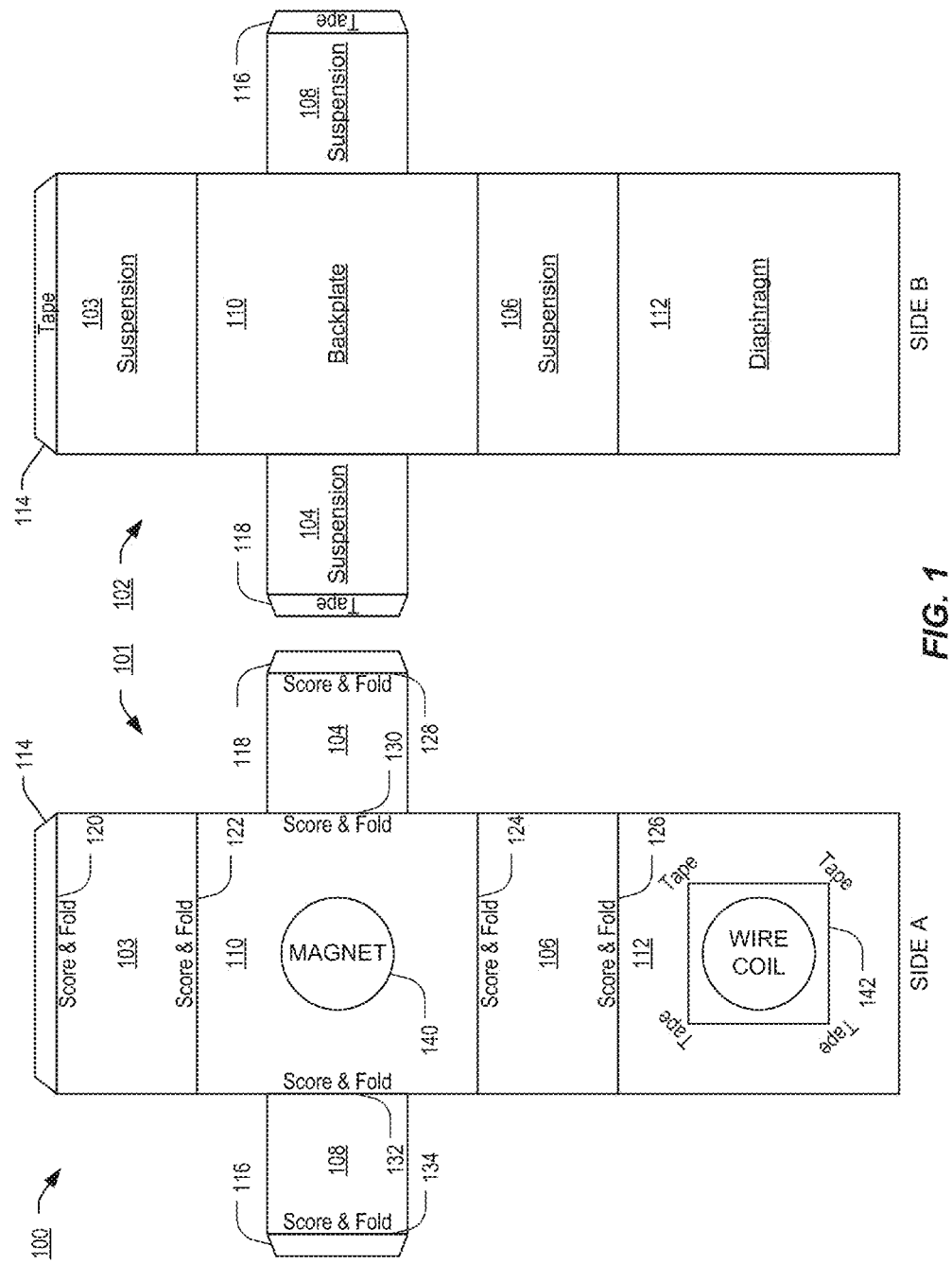
FIG. 1 is a diagram of an illustrative embodiment of a single sheet of paper including instructions to form a paper speaker from the single sheet of paper.

FIG. 1 is a diagram 100 depicting two sides (designated side A and side B) of a single sheet of paper that is manipulatable to create (e.g., form or assemble) a paper speaker. Side B is the reverse of side A and vice versa. A first pattern 101 is printed on side A of the piece of paper and a second pattern 102 is printed on side B of the piece of paper. In a particular embodiment, the patterns 101 and 102 are printed on opposite sides of a piece of paper printed on 32 lb. paper stock. Each pattern 101 and 102 includes six rectangular sections, designated in FIG. 1 as sections 103, 110, 108, 104, 106, and 112 respectively. Each pattern 101 and 102 also includes three flap sections 114, 116, and 118. Corresponding sections on each side of the single sheet of paper are referenced using the same reference number. Thus, the section 108 is on the left-hand side on side A but the right hand side on side B.

In the first pattern 101, the flap section 114 is separated from the section 103 by a line segment 120. The section 103 is separated from the section 110 by a line segment 122. The flap section 116 is separated from the section 108 by a line segment 134. The section 108 is separated from the section 110 by a line segment 132. The section 110 is separated from the section 104 by a line segment 130. The section 110 is separated from the section 106 by a line segment 124. The section 106 is separated from the section 112 by a line segment 126. The sections 104 and 118 are separated by a line segment 128. Each of the line segments represents a line along which the sheet of paper is scored and folded during construction of the paper speaker, as further described herein.

In a particular embodiment, the single sheet of paper includes (e.g., printed thereon) instructions regarding how to assemble the paper speaker. For example, as shown in FIG. 1, side A includes instructions such as "Score & Fold," "Tape," "MAGNET" (attach a magnet in corresponding area 140), and "WIRE COIL" (attach a wire coil in corresponding area 142).

The first pattern 101 and the second pattern 102 enable construction of a paper speaker from a single sheet of paper. Once the sections 103-118 are cut from the piece of paper and the instructions are followed, the section 103, the section 104, the section 106, and the section 108 form a suspension of the paper speaker. The section 110 forms a backplate of the paper speaker, and the section 112 forms a diaphragm of the paper speaker. The "backplate" of the paper speaker is the panel of the paper speaker that the magnet is attached to. In a particular embodiment, the backplate is designed to rest against a fixed or sturdy surface such as a table, to prevent the backplate from deforming during operation. The "diaphragm" of the paper speaker is the portion of the paper speaker that oscillates to generate sound waves. The "suspension" of the paper speaker holds the diaphragm in place and enables the diaphragm to maintain its shape.

Figure 2:
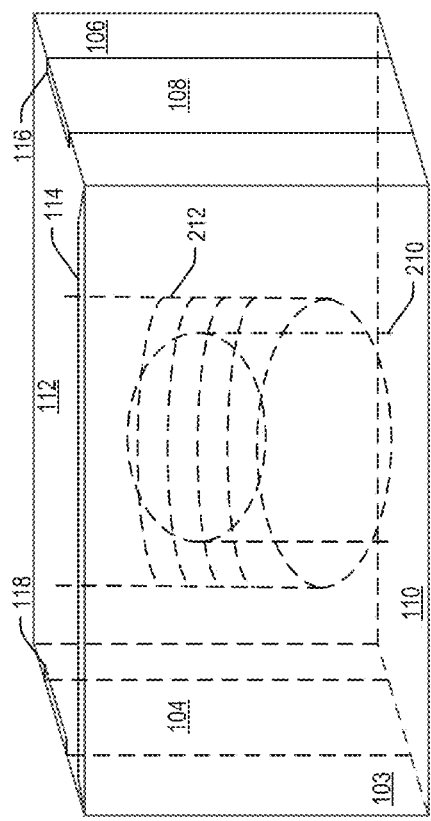
FIG. 2 is a diagram of an illustrative embodiment of a paper speaker formed from the single sheet of paper illustrated in FIG. 1.

Referring to FIG. 2, a diagram 200 depicting the constructed paper speaker is shown. The constructed paper speaker includes the sections 103-118, a magnet 210 and a wire coil 212. In the illustrated example, the magnet 210 is a cylinder magnet. The wire coil 212 is positioned over and around the magnet 210. A method of folding the single sheet of paper to position the wire coil 212 over the magnet 210 is further described with reference to FIG. 4.

During operation, a current is selectively passed through the wire coil 212 to generate a magnetic field that interacts with a magnetic field of the magnet 210 to generate a magnetic force. The magnetic force drives the section 112 (the diaphragm) of the paper speaker. The section 112, in turn, displaces air and produces sound. The sections 103-108 (the suspension) provide a restorative force, in a direction opposite of the magnetic force, to the section 112 so that the paper speaker maintains its shape. It will thus be appreciated that the paper speaker described with reference to FIGS. 1 and 2 can be included in an audio demonstration kit and constructed by a user (e.g., a preteen or teenager, a hobbyist, etc.) by following instructions printed on the paper speaker and can be examined to learn about scientific concepts such as electricity, magnetism, transduction, sound, etc.

Figure 3:
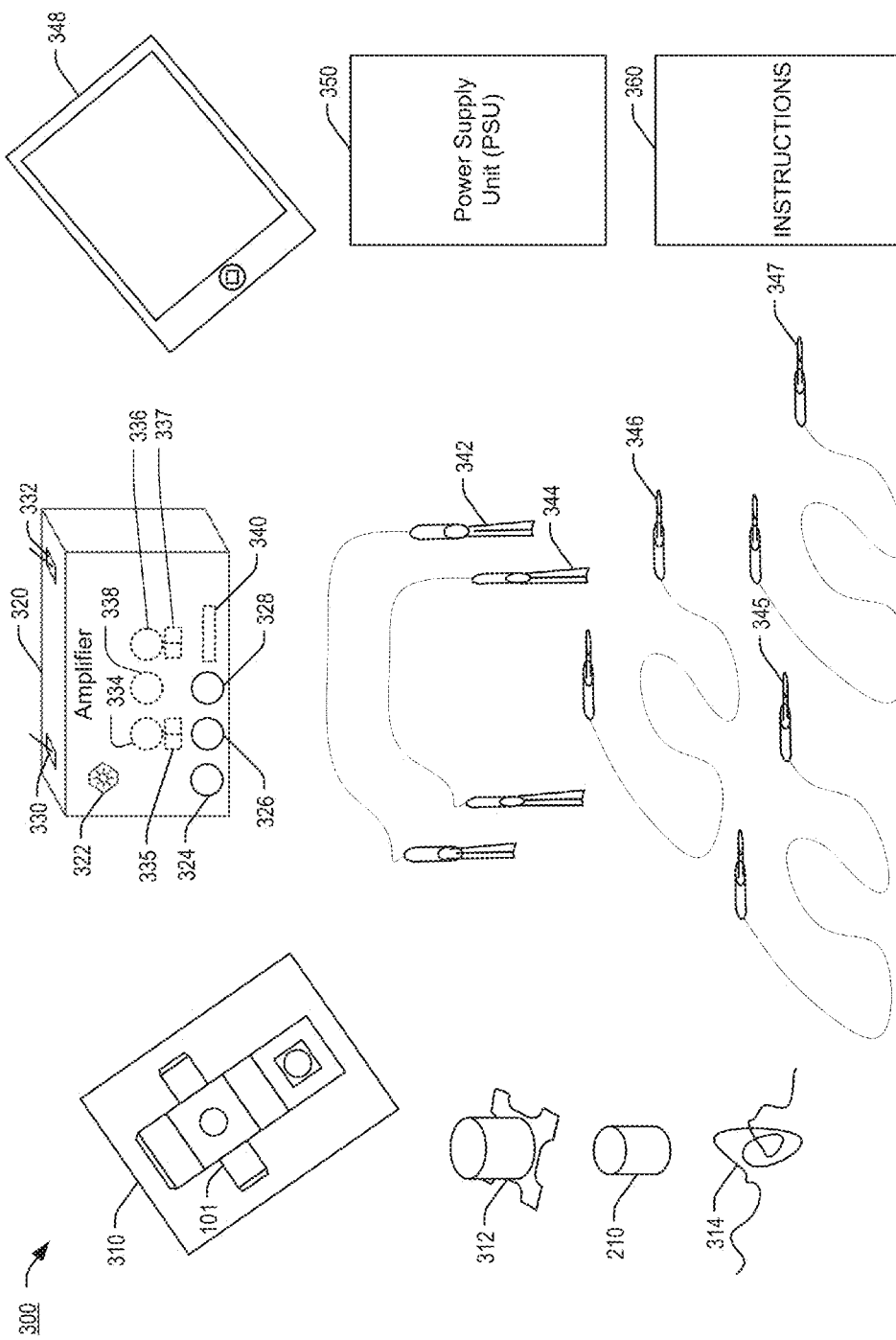
FIG. 3 is a diagram of an illustrative embodiment of components of an audio demonstration kit.

Referring to FIG. 3, an illustration 300 of components of an audio demonstration kit is shown. The audio demonstration kit includes a sheet of paper 310. In an illustrative embodiment, the sheet of paper 310 is the sheet of paper described with reference to FIG. 1. For example, the sheet of paper 310 includes the first pattern 101 of FIG. 1 on a first side and the second pattern 102 (not shown) on a second side (not shown). The audio demonstration kit further includes a bobbin 312 and a wire 314 having a particular length wire. In the illustrated example, the bobbin 312 is a plastic cylinder bobbin. The audio demonstration kit further includes the magnet 210.

The audio demonstration kit includes an amplifier 320, which is alternatively referred to herein as an amplifier module or an amplifier circuit board. The amplifier 320 includes a strobe light 322 and a strobe control 324 (e.g., −5 Hz to +5 Hz and/or 0 degree phase to 360 degree phase), which is illustrated in FIG. 3 as a rotary knob. The amplifier 320 further includes a volume control 326 and a tone control 328 (e.g., 10 Hz to 100 Hz), which are illustrated in FIG. 3 as rotary knobs. The amplifier 320 includes a right channel output port 334 and a left channel output port 336. The amplifier 320 also includes a first set of electrical contacts 335 associated with the right channel output port 334 and a second set of electrical contacts 337 associated with the left output port 336. The amplifier 320 further includes an input port 338 configured to receive audio input from an audio device and a power connector 340 configured to receive power from a power source (e.g., an alternating current (AC) power source or a direct current (DC) power source). The audio demonstration kit further includes a power supply unit (PSU) 350. In particular embodiments, the PSU 350 is a 12 volt battery-powered source. In an alternative embodiment, the PSU 350 is a 12 volt non-battery source (e.g., a power adapter connectable to an electrical outlet).

In a particular embodiment, the amplifier 320 includes a first switch 330 and a second switch 332. The first switch 330 is configured to switch the amplifier 320 between operating in a monaural (e.g., single-channel) mode and operating in a stereo (e.g., dual-channel) mode. In the monaural mode, the amplifier 320 outputs an audio signal to a single speaker. In the stereo mode, the amplifier 320 outputs audio signals to two speakers. The second switch 332 is configured to switch the amplifier 320 between delivering right and left audio signals through the right channel output port 334 and the left channel output port 336 and commutating current through the right channel output port 334 and the left channel output port 336 to drive a rotary motor, as further described with reference to FIGS. 9B and 9C.

In a particular embodiment, the audio demonstration kit includes a first alligator clip cable 342 and a second alligator clip cable 344. The audio demonstration kit further includes a first audio cable 346. The audio demonstration kit includes a second audio cable 345 and a third audio cable 347. The amplifier 320 can be connected to a device 348, such as a mobile phone, a tablet computer, and/or a portable media player with the first audio cable 346. In particular embodiments, the first audio cable 346 is a universal serial bus (USB) cable or a 3.5 mm audio cable. The second audio cable 345 and the third audio cable 347 are used to connect the amplifier 320 to left and right speakers. The audio demonstration kit further includes instructions 360 directing a user to use illustrated components to assemble audio demonstration items, such as a paper speaker, a cardboard speaker, an amplifier and a control unit, etc. In a particular embodiment, the instructions 360 are printed on the sheet of paper 310 (e.g., in the margins of the sheet of paper 310 around the first pattern 101). Alternately, the instructions are printed in a separate booklet.

In a particular embodiment, the instructions 360 direct a user to wind the wire 314 around the bobbin 312 to create the wire coil 212. The wire coil 212 and the magnet 210 are attached (e.g., taped) to the sheet of paper 310 and the sheet of paper 310 is folded, as described with reference to FIGS. 1, 2, and 4, to create a paper speaker. The wire coil 212 is connected to the amplifier 320 via the first alligator clip cable 342 and the second alligator clip cable 344. The first alligator clip cable 342 and the second alligator clip cable 344 connect to a positive terminal and a negative terminal of either the first set of electrical contacts 335 or the second set of electrical contacts 337.

The PSU 350 is connected to the power connector 340 and delivers power to the amplifier 320. The device 348, when connected to the input port 338 via the first audio cable 346, delivers an audio signal to the amplifier 320. The amplifier 320 amplifies the audio signal and outputs the amplified audio signal to the paper speaker via the first alligator clip cable 342 and the second alligator clip cable 344. The amplified audio signal is passed through the wire coil 312 generating a magnetic field. The magnetic field interacts with a magnetic field of the magnet 310 creating an alternately repelling or attracting force, depending on a direction of current through the wire coil 312. The repelling force pushes the wire coil 312 away from the magnet 310 and the attracting force pulls the wire coil 312 toward the magnet 310, causing the diaphragm of the paper speaker to oscillate (e.g., vibrate) back and forth. The oscillation of the diaphragm causes oscillating changes in air pressure that are detectable by a human ear as sound.

It should be noted that the various components illustrated in FIG. 3 are for example and not to be considered limiting. In alternate embodiments, more, fewer, or different components may be included in an audio demonstration kit.

Figure 4:
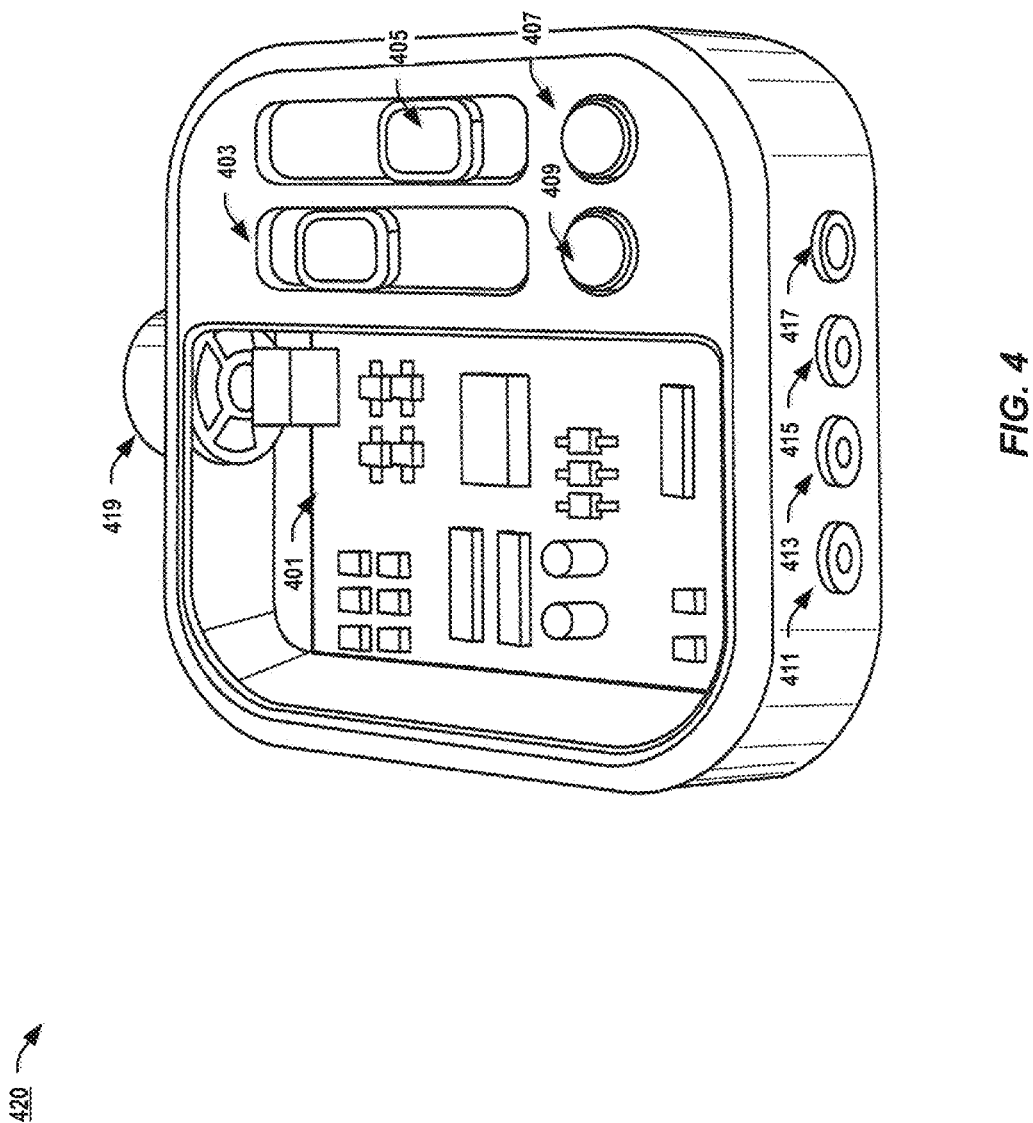
FIG. 4 shows a perspective view of an illustrative embodiment of an amplifier.

FIG. 4 shows a perspective view of an embodiment of an amplifier 420. The amplifier may be similar to the block diagram representation of the amplifier 320 shown in FIG. 3, for example. The amplifier 420 includes various user input mechanisms operable to control circuitry 401 housed within the amplifier 420. More particularly, the amplifier 420 includes a strobe control 403 and a tone control 405. As shown in FIG. 4, the strobe control 403 and the tone control 405 comprise potentiometers (e.g., sliders). However, controls of other embodiments include other user input mechanisms, such as surface that sense a user tapping to a musical beat, or controls implemented on a tablet or smartphone and communicated over a control channel to the amplifier system. The tapping or sliding of potentiometer facilitates synchronization of the beat and a strobe light, for instance. A play button 407 and a stop button 409 further receive user input. The amplifier 420 additionally features an auxiliary port 411, as well as a right channel output port 413 and a left channel output port 415. The amplifier 420 further includes a power input port 417 to receive power from an AC or DC power source. A rotary knob 419 is configured to adjust volume.

Figure 5:
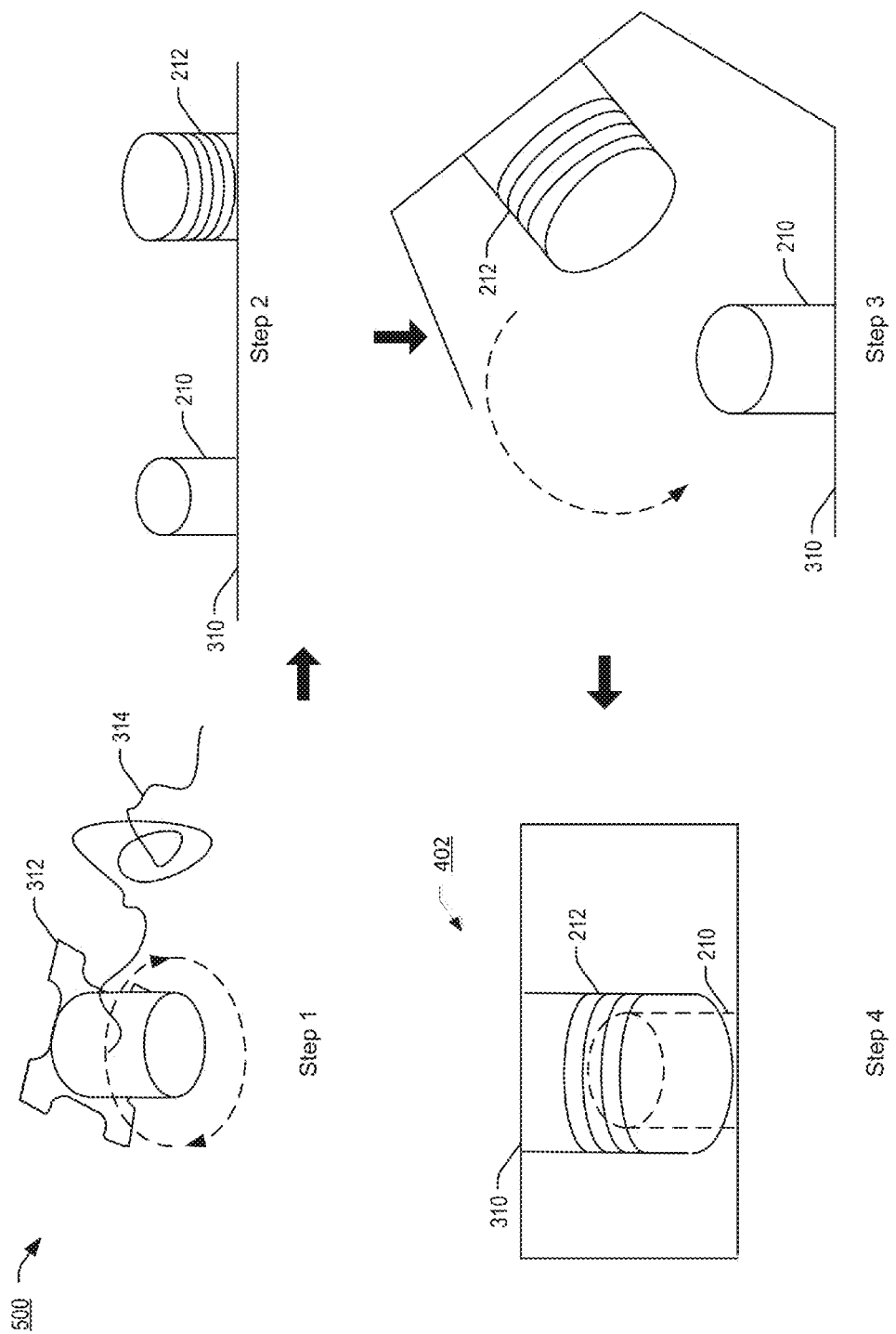
FIG. 5 is a diagram that illustrates assembling the paper speaker of FIG. 2.

Referring to FIG. 5, a diagram 500 that illustrates assembling of the paper speaker of FIG. 2 is shown. At step 1, the wire 314 is wound around the bobbin 312 to form the wire coil 212. In one example, the wire 314 is at least 25 feet long and is tightly wound at least 100 times around the bobbin 312. At step 2, the magnet 210 and the wire coil 212 are placed (e.g., attached using tape) on the sheet of paper 310. For example, referring to FIG. 1, the magnet 210 may be attached to the region denoted "MAGNET" and the wire coil 212 may be attached to the region denoted "WIRE COIL." At step 3, the paper 310 is scored and folded as indicated, so that the wire coil 212 is positioned over and around the magnet 210. In step 4, additional panels of the paper speaker are then folded and/or taped to generate an enclosed paper speaker 402 according to the instructions printed in the pattern 101, as shown in FIG. 1.

Figure 6:
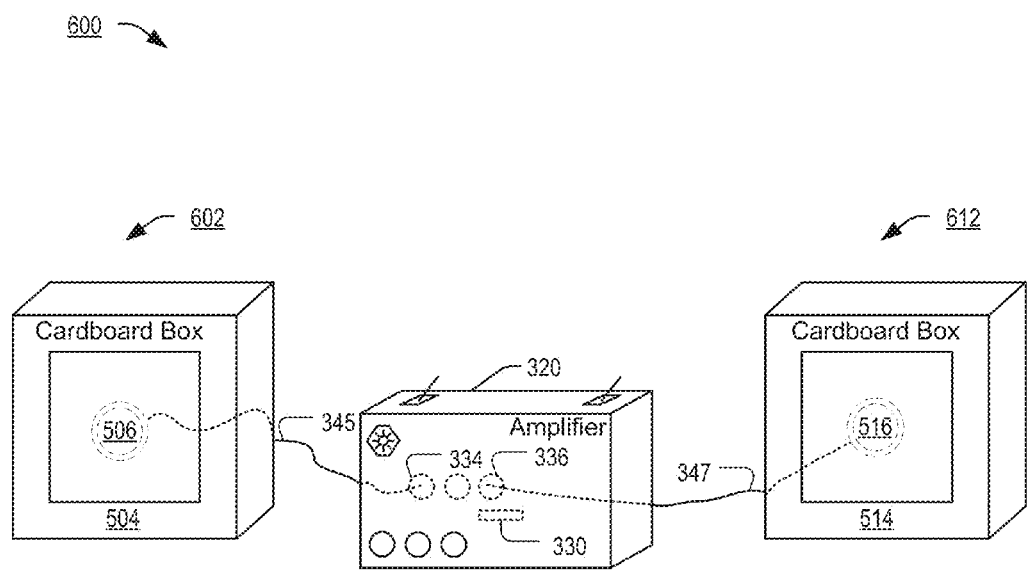
FIG. 6 is a diagram of an illustrative embodiment of an audio demonstration kit including stereo speakers constructed from packaging of the audio demonstration kit.

Referring to FIG. 6, a diagram 600 of an illustrative embodiment of an audio demonstration kit including stereo speakers constructed from packaging of the audio demonstration kit is shown. The audio demonstration kit includes a right speaker 502 (e.g., a first user-built speaker), the audio cable 345, the amplifier 320, the audio cable 347, and a left speaker 512 (e.g., a second user-built speaker). The right speaker 502 includes a first cardboard box 504 and a first acoustic transducer 506. The first acoustic transducer 506 is attached to the first cardboard box 504, and the walls of the cardboard box 504 form a backplate, a suspension, and a diaphragm. In a particular embodiment, the first acoustic transducer 506 includes a magnet and a wire coil, as described with reference to the paper speaker of FIGS. 1, 2, and 5. The left speaker 512 includes a second cardboard box 514 and a second acoustic transducer 516. The second acoustic transducer 516 is attached to the second cardboard box 514 and the walls of the second cardboard box 514 form a backplate, a suspension, and a diaphragm. The second acoustic transducer 516 includes a second magnet and a second wire coil, as described with reference to the paper speaker of FIGS. 1, 2, and 5.

In a particular embodiment, the first cardboard box 504 and the second cardboard box 514 form at least a part of the packaging of the audio demonstration kit (e.g., the audio demonstration kit is contained with the first cardboard box 504 and the second cardboard box 514, and the cardboard boxes 504 and 514 are attached to each other, when the audio demonstration kit is sold). In particular embodiments, the packaging further includes all or some of the additional audio demonstration kit components illustrated in FIG. 3 (e.g., the first alligator clip cable 342, the second alligator clip cable 344, the instructions 360, the sheet of paper 310, the wire 314, the magnet 210, the bobbin 312, the audio cable 346, and/or the PSU 350).

The right speaker 502 is connected to the amplifier 320 via the audio cable 345. In a particular embodiment, the audio cable 345 connects to the right channel output port 334 of the amplifier 320. The left speaker 512 is connected to the amplifier 320 via the audio cable 347. In a particular embodiment, the audio cable 347 connects to the left channel output port 336 of the amplifier 320. In a particular embodiment, instructions such as the instructions 360 of FIG. 3 describe assembly of the audio demonstration kit.

Figure 7:
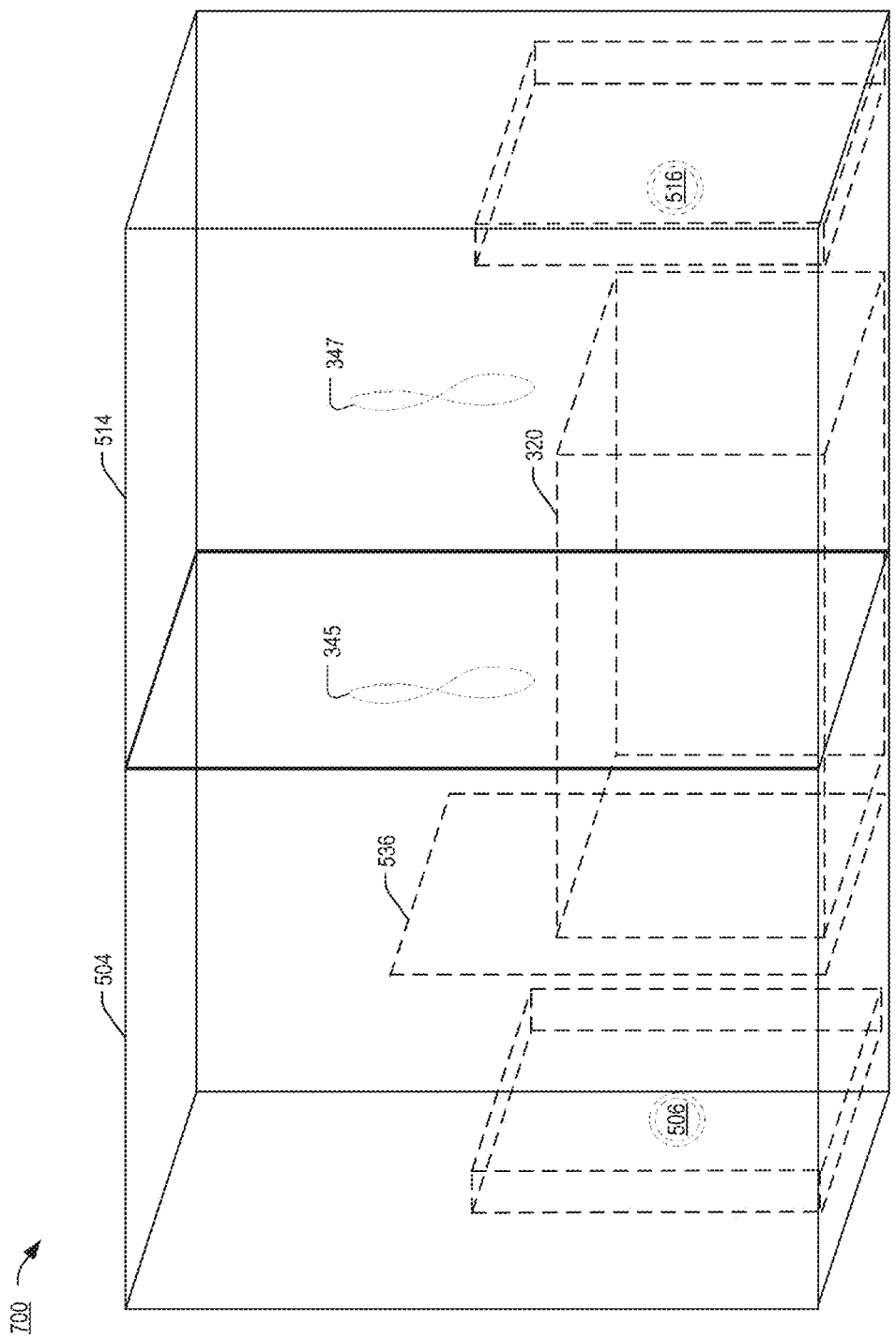
FIG. 7 is a diagram of an illustrative embodiment of packaging associated with an audio demonstration kit.
Figure 8:
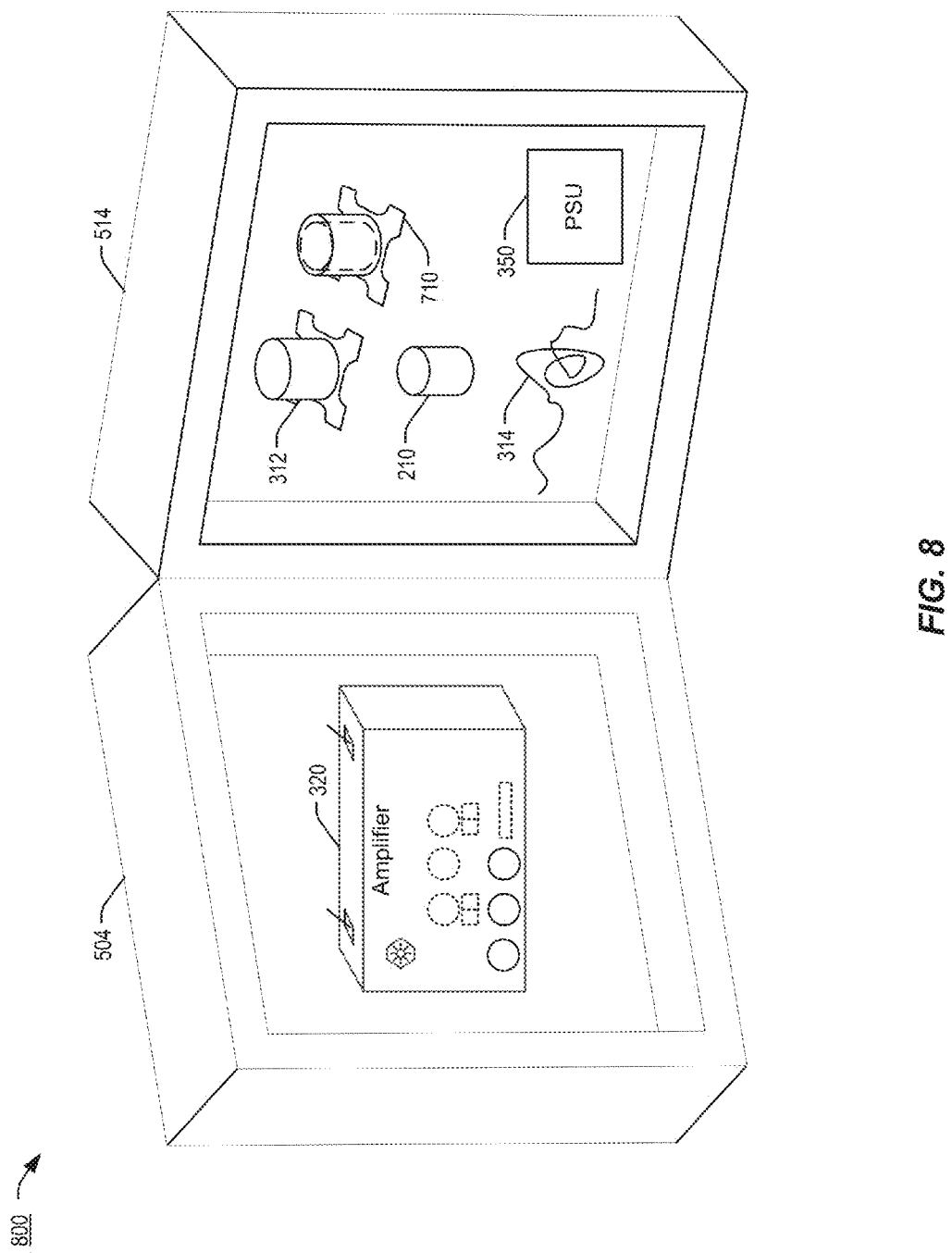
FIG. 8 is a diagram of the packaging of FIG. 7 when opened.

For example, FIGS. 7 and 8 illustrate embodiments of packaging for an audio demonstration kit and are generally designated 700 and 800, respectively. The packaging includes the first cardboard box 504 and the second cardboard box 514, each of which can form a partial enclosure for a user-built speaker. When the audio demonstration kit is purchased, the cardboard boxes 504 and 514 form a complete enclosure that encloses other components of the audio demonstration kit. For example, the amplifier 320, the magnet 210, the wire 314, the power supply unit 350, the acoustic transducers 506 and 516, the instructions 536, and/or the cables 345 and 347 can be included within packaging of the audio demonstration kit. In some embodiments, one or more pre-fabricated transducers 710 are included instead of the magnet 210, the bobbin 312, and the wire 314. It should be noted that although not shown in FIGS. 6 and 7, all or some of the additional audio demonstration kit components described herein can also be included within the packaging of the audio demonstration kit. In particular embodiments, one cardboard box forms the enclosure and the other cardboard box fits inside the enclosure. Thus, the audio demonstration kit of FIGS. 7 and 8 may be sold, shipped, and stored in a small space, because packaging of the audio demonstration kit can be reused during construction of user-built speaker(s).

Figure 9:
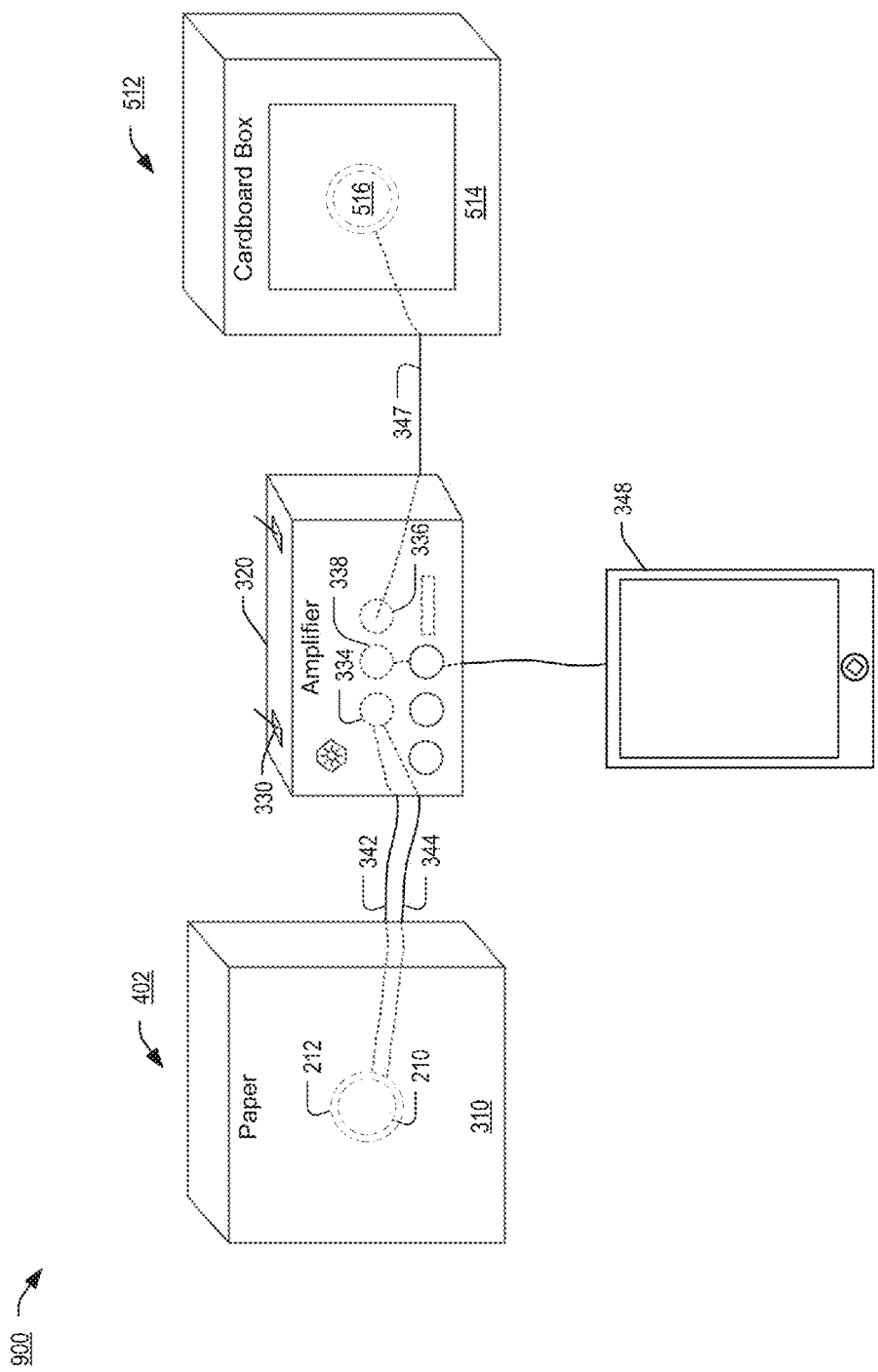
FIG. 9 is a diagram of an illustrative embodiment of a mixed mode audio demonstration kit.

It should be noted that various embodiments described herein are combinable. For example, FIG. 9 is a diagram of an illustrative embodiment of a mixed mode audio demonstration kit, designated 900. The mixed mode audio demonstration kit 900 includes the paper speaker 402, the amplifier 320, and a cardboard speaker (e.g., the left speaker 512). In a particular embodiment, the paper speaker 402 includes the sheet of paper 310, the wire coil 212, and the magnet 210. In the example of FIG. 9, the paper speaker 402 acts as a right speaker 502. The left speaker 512 includes the cardboard box 514 and the second acoustic transducer 516.

The speakers 402 and 512 are connected to the amplifier 320, which includes the first switch 330, the right channel output port 334, and the left channel output port 336. Depending on implementation, the speakers 402 and 512 may be connected to the amplifier 320 using one or two cables. For example, in FIG. 9, the paper speaker 402 is connected to the right channel output port 334 (or electrical contacts associated therewith) via the first alligator clip cable 342 and the second alligator clip cable 344. One of the cables may be connected to a positive (+) terminal and the other cable may be connected to a negative (−) terminal. In particular embodiments, the positive and negative terminals are indicated by particular colors. For example, the positive terminal may be indicated by red and the negative terminal may be indicated by black. The left speaker 512 is connected to the left channel output port 336 via the single cable 347. It should be noted that the use of one paper speaker and one cardboard speaker is for example only. In alternate embodiments, the mixed mode audio demonstration kit 800 includes two paper speakers or two cardboard speakers.

When the first switch 330 is in a first position, the amplifier 320 operates in a stereo mode. When operating in the stereo mode, the amplifier 320 delivers amplified audio signals to both of the output ports 334 and 336. When the first switch 330 is in a second position, the amplifier 320 operates in a monaural mode. When operating in the monaural mode, the amplifier 320 delivers an amplified audio signal to one, but not both, of the audio ports 334 and 336. In a particular embodiment, the amplifier 320 outputs the amplified audio signals to the paper speaker 402 in the monaural mode. In one example, the amplifier 320 generates amplified audio signals based on an input audio signal received from the device 348 via the input port 338, as shown.

FIG. 10 shows an embodiment of an audio demonstration kit 940 that includes speakers 942, 944 that are constructed and deconstructed in a repeatable manner. The first speaker 942 is connected to an amplifier 420 via a cable 946, and the second speaker 944 is connected to the amplifier via cable 948. The first speaker 942 includes speaker elements that include a cone 950, as well as a magnet and coil (not shown). Similarly, the second speaker 944 includes a cone 952 and other speaker elements.

The speaker elements are partially enclosed within an enclosure 954 of the first speaker 944. A lid 956 aligns with the edges of the enclosure 954 to repeatably form a seal and at least a partial enclosure. Similarly, an enclosure 958 aligns with a lid 960 to enclose speaker elements of the second speaker 944. The enclosures 954, 958 and lids 956, 960 are constructed from rigid or semi-rigid materials to assist a child in aligning and creating a seal while learning how to build a speaker system. The speaker elements (via rigid guide structures inside of the enclosures 954, 958) are likewise configured to be repeatably aligned and deconstructed to encourage experiment and understanding. The enclosures, or partial enclosures, of an embodiment are modular in that smaller partial enclosures are combined to create a larger enclosure. Enclosures are manufactured from rigid or flexible materials are combined using snaps, grooves, rubber bands, magnets, adhesive or other known fastening mechanisms. Attachment of the enclosures 954, 958 and lids 956, 960 produces a satisfying tactile response, such as a snap, to reinforce that an effective seal has been achieved.

Referring to FIG. 11A, a diagram of an illustrative embodiment of an audio demonstration kit that includes an oscillating element is shown. In FIG. 11A, the paper speaker 402 is connected to the right channel output port 334 via the first alligator clip cable 342 and the second alligator clip cable 344. When the switch 332 is in a first position (e.g., indicates a first mode), the amplifier 320 outputs an amplified audio signal to the paper speaker 402. The output induces a magnetic field in the wire coil 212, which interacts with a magnetic field of the magnet 210 to move a diaphragm of the speaker 402 back and forth. The back and forth movement of the diaphragm of the speaker produces oscillations in air pressure detectable as sound. When the switch 332 is in a second position (e.g., indicates a second mode), the amplifier 320 commutates current in the wire coil 212 to move the diaphragm of the paper speaker 402 back and forth as an oscillating element. For example, the oscillating element actuates a motion element 950 attached to the diaphragm. In FIG. 11A, the motion element 950 is a user-made paper sculpture. For example, an audio demonstration kit may include a paper template for the paper sculpture and instructions directing a user to make the paper sculpture from the template.

In alternate embodiments, the amplifier 320 also commutates current in a second coil connected to the left channel output port 336 to produce the back and forth movement of the oscillating element. In a particular embodiment, output sent to the oscillating element is low frequency output. In some embodiments, the output sent to the oscillating element is synchronized with the strobe light 322 and the frequency of the strobe light 322 is controlled by the strobe control 324, as further described herein.

Referring to FIG. 11B, a rotary motor 902 is shown connected to the amplifier 320. The rotary motor 902 includes a first wire coil 926, a second wire coil 928, and a magnet 930. The magnet 930 is positioned (e.g., mounted) so as to revolve around an axis 924, such that a first end of the magnet 930 and a second end of the magnet 930 pass in close proximity to the first wire coil 926 and the second wire coil 928. The rotary motor 902 is illustrated in further detail in FIG. 11C. A common plane intersects the rotating magnet 930, the first wire coil 926, and the second wire coil 928. The first wire coil 926 lies in a first plane (e.g., corresponding to the bottom panel in FIG. 11B) and the second wire coil 928 lies in a second plane (e.g., corresponding to the left side panel in FIG. 11B). The first plane and the second plane are perpendicular to each other. Further, orthogonal vectors of both the first plane and the second plane are perpendicular to the axis 924. The first wire coil 926 is connected to the left channel output port 336 (or electrical contacts associated therewith) via alligator clip cables 932 and 934. The second wire coil 928 is connected to the right channel output port 334 via the first alligator clip cable 342 and the second alligator cable 344. When the switch 332 indicates the second mode, the amplifier 320 commutates current in the first coil 926 and the second coil 928 causing the magnet 930 to rotate about the axis 924. In particular embodiments, the rotary motor 902, the third alligator clip cable 932, and the fourth alligator clip cable 934 are included in the packaging of the audio demonstration kit described with reference to FIG. 3 or FIG. 6. It will thus be appreciated that the magnet 930 rotating about the axis 924 can be used to demonstrate how a rotary motor functions. In another embodiment may include a single coil of wire.

Referring to FIG. 12, an illustrative embodiment of an audio demonstration kit 920 that includes an oscillating element 950 is shown. The audio demonstration kit 920 includes a video recording device (e.g., a camera 1046), the paper speaker 402 operating as an oscillating element, and the amplifier 320. In particular embodiments, the camera 1046 is integrated into a mobile phone, a portable computing device, a tablet computing device, a portable media player, a gaming device, or any combination thereof. The motion element 950 is attached to the oscillating element, as shown.

During operation, the amplifier 320 operating in the second mode commutates current in the wire coil 212 of the paper speaker 402, causing the diaphragm of the paper speaker 402 to oscillate. The oscillation of the diaphragm actuates the motion element 950 by pushing and pulling the motion element 950 back and forth. In other embodiments, a different motion element is used (e.g., a small plastic figurine, etc.).

In FIG. 12, the strobe control 324 is illustrated as a rotary knob. When the strobe light 322 of the amplifier 320 is switched on by the strobe control 324, the amplifier 320 causes the strobe light to flash at a particular strobe frequency. When the strobe control 324 is turned to a first position, the amplifier 320 operates the strobe light 322 in a phase mode. When the strobe control 324 is turned to a second position, the amplifier 320 operates the strobe light 322 in a delta mode. When the strobe light 322 is operating in the phase mode, the strobe frequency corresponds to a phase of the oscillations of the paper speaker 402, causing the strobe light 322 to flash when the motion element 950 is at a particular position. Therefore, flashing the strobe light 322 in phase with the paper speaker 402 causes the motion element 950 to appear to be "frozen" in place despite the fact that the motion element 950 is oscillating with the paper speaker 402. In the delta mode, the strobe light 322 flashes out of phase with the oscillations of the paper speaker 402. Therefore, in the delta mode, the strobe light 322 flashes when the motion element 950 is in various stages of oscillation. When, the strobe light 322 is operating in the delta mode, the strobe frequency is adjustable via the strobe control 324 (e.g., turning the strobe control 324 adjusts the strobe frequency). Adjusting the strobe frequency causes oscillations of the motion element 950 to change in speed. In alternative embodiments, separate controls are used to switch the amplifier 320 between the phase mode and the delta mode and to adjust the strobe frequency.

The camera 1046 captures frames of video of the motion element 950 at a particular capture rate (or frame rate). In the illustrated embodiment, the amplifier 320 communicates with the camera 1046 via a cable 1050. In a particular embodiment, the amplifier 320 synchronizes one or both of the strobe frequency or the movement of the motion element 950 to the frame rate of the camera 1046. In a particular embodiment, the amplifier 320 receives an indication of the capture rate or frame rate of the camera 1046 via the cable 1050 (or a wireless connection) and adjusts the strobe light frequency accordingly. In alternative embodiments, the amplifier 320 adjusts the frame rate of the camera 1046 to match the strobe frequency or the movement of the motion element 950.

It will be appreciated that adjusting the strobe mode and frequency can be used to demonstrate concepts such as oscillation time period, frequency, and frame rate.

FIG. 13 is a perspective view of an audio demonstration kit 970 that includes an amplifier 420 and moveable assembly 972 that a user synchronizes to a beat. The amplifier 420 is an embodiment of the amplifier 320 of FIG. 12. A strobe light, such as the strobe light 322 of FIG. 12, is likewise synchronized to the moveable assembly 972, and possibly, to a frame rate of a video recording device. Flexible elements 978 may appear to dance in response to actuation of the moveable assembly 972 and operation of the strobe light.

At least one of the movement of the moveable platform and the activation of the strobe light is coordinated with a frame rate of the video recording device. For example, the camera 1046 of FIG. 12, which may include a camera of a smart phone, is used as a basis to set a frequency of the strobe light. The strobe light is initially timed to a default setting that corresponds to a common frame rate. A user may adjust the setting using an input mechanism on the amplifier 420 to set the frame rate to enable effective video recording. The amplifier 420 may subsequently retain the adjusted frame rate for future use.

The flexible elements 978 include interlocking pieces of a material that wobbles and bounces as a platform 976 is moved. Movement of an embodiment of platform 976 selectively includes horizontal and vertical actuation, and is actuated by movement of a base section 974. As shown, the flexible elements 978 are punched or cut out of a flat construction kit. The flexible elements 978 are manufactured from materials of differing flexibility (e.g., rigidity) characteristics and may be color coded to for ease of distinguishing. Flexible elements of varying dimensions are contemplated, such as blocks. Flexible elements may be compatible with proprietary interlocking construction toys. The flexible elements 978 attach to the platform 976 using projections 980 or other fasteners. The flexible elements 978 may attach to one another to allow a child to construct composite sculptures.

A user actuates a button or potentiometer on the amplifier 420 in time with the beat of music to cause the moveable assembly 972 to move. In another embodiment, a user input circuit includes a surface of the amplifier 420 that registers a tap (e.g., to a musical beat) by the user. When used in connection with at least one of the strobe light and video camera, the flexible elements 978 move in interesting ways that make the sculptures appear to come alive. Movement of the flexible elements 978, including when sculptures are shaken apart, is studied using recorded video.

The user synchronizes the dancing movement to music using the user input circuitry. For instance, the user synchronizes the music by tapping or sliding a control as they feel compelled by beat of music. When the strobe light is illuminated, the flexible elements 978 appear to dance to the music. This feature allows the user to feel a connection between their performance and performance of a jiggling sculpture comprised of the flexible elements 978. In this manner, the user input (relating to music) synchronizes and otherwise coordinates operation of the strobe light and the movement of the moveable assembly 972 to one another. The flexible elements of an embodiment are compatible with other popular or proprietary building and constructions sets (made of rigid or semi rigid elements). While strobe lights and video cameras are discussed herein, another embodiment uses a spinning disk with slits or in combination with the strobe light system (e.g., to essentially provide an experience of a user's eye like would a camera have with shutters).

FIG. 14 is a block diagram of an illustrative embodiment of an audio demonstration kit 1100. The audio demonstration kit 1100 includes an amplifier module 1120 and one or more user-built speakers 1190. In an illustrative embodiment, the amplifier module 1120 corresponds to the amplifier 320. In an illustrative embodiment, the user-built speakers 1190 correspond to the paper speaker 402, the right speaker 502, and/or the left speaker 512.

The amplifier module 1120 includes a tone control 1128, a volume control 1126, and a strobe control 1124. In particular embodiments, the tone control 1128, the volume control 1126, the strobe control 1124, or any combination thereof are rotary knobs or other potentiometers (e.g., sliders) configured to receive user input regarding tone, volume, and/or strobe light adjustment. In alternative embodiments, the tone control 1128, the volume control 1126, the strobe control 1124, or any combination thereof are digital input devices. The amplifier module 1120 further includes an audio input 1180, a processor 1182, a strobe driver 1188 (e.g., a strobe generator), a strobe 1122, a power amplifier 1184, and a connector 1186. The user-built speakers each include a connector, designated in FIG. 11 as connectors 1192 and 1194 respectively.

In operation, the processor 1182 receives an audio signal via the audio input 1180. The audio signal can be received from an electronic device (e.g., a microphone, a mobile phone, a tablet computer, a portable media player, etc.). In addition, the processor 1182 receives control signals (such as from the tone control 1128 and the volume control 1126). Based on the control signals, the processor 1182 manipulates the audio signal. For example, the processor 1182 increases or decreases volume of the audio signal based on a control signal received from the volume control 1126. The processor 1182 raises and lowers pitch of the audio signal (e.g., by varying a speed at which a direction that current passed through the user built speakers 1190 switches back and forth) in response to a control signal received from the tone control 1128. After manipulating the audio signal in response to the audio control signals, the processor 1182 sends the audio signal to the power amplifier 1184.

The power amplifier 1184 amplifies the audio signal and provides the amplified audio signal(s) to the connector 1186. The connector 1186 provides the amplified audio signal(s) to one or both of the connectors 1192, 1194 of the user-built speakers 1190. For example, the amplifier module 1120 can operate in either a monaural mode or in a stereo mode. When operating in the monaural mode, the connector 1186 provides the amplified audio signal to either the connector 1192 or the connector 1194, but not both. When operating in the stereo mode, the connector 1186 provides the amplified audio signal to both the connector 1192 and the connector 1194. In particular embodiments, the mixer 1242 provides a left audio signal and a right audio signal to the volume module 1244 to be sent to the power amplifier 1246. The power amplifier 1246 provides an amplified left audio signal to a left terminal of the printed circuit board terminals 1248 and an amplified right signal to a right terminal of the printed circuit board terminals 1248. One or both of the user-built speakers 1190 generate sound based on the received amplified audio signal(s).

The processor 1182 also receives a strobe control signal from the strobe control 1124. In response to the strobe control signal, the processor 1182 sends a signal to the strobe driver 1188 to control a frequency at which the strobe driver 1188 provides power to the strobe 1122 (e.g., a light source) to generate a flashing light. In a particular embodiment, the frequency is determined based at least in part on a frequency of the audio signal. In some embodiments, the amplifier module 1220 is in communication with a recording device, and the frequency is determined based at least in part on a frame rate of the recording device. Alternatively, the frame rate of the recording device is set by the amplifier 1220 based on the frequency.

FIG. 15 is a block diagram 1200 of an illustrative embodiment of an amplifier module 1220. The amplifier module 1220 includes a buffer 1240, a microcontroller 1250, a low pass filter 1252, a mixer 1242, a volume module 1244, a power amplifier 1246, and printed circuit board terminals 1248. According to an embodiment, the low pass filter, mixer, and volume module are functions executed by a digital signal processor (DSP). The amplifier module 1220 further includes a protection and load switch 1256 and a strobe driver 1258.

In operation, the protection and load switch 1256 is responsive to a power switch 1254. When the power switch 1254 is switched in a first (e.g., "on") position, the protection and load switch 1256 provides power from a power source 1260 (e.g., the PSU 350) to the microcontroller 1250, to the power amplifier 1246, to the strobe driver 1258, and to a power/status indicator 1262. The buffer 1240 receives an audio signal via the audio input 1280 (e.g., from an external device, such as the device 348) and provides the audio signal to the mixer 1242. The microcontroller 1250 receives a tone control signal from the tone control 1228 and passes the tone control signal through the low pass filter 1252 to the mixer 1242. The mixer 1242 adjusts the tone of the audio signal based on the tone control signal received from the tone control 1228 and provides the adjusted audio signal to the volume module 1244.

The volume module 1244 receives a volume control signal from the volume control 1226, adjusts a volume (e.g., amplitude) of the audio signal based on the volume control signal, and provides the adjusted audio signal to the power amplifier 1246. The volume module 1244 adjusts the amplitude of the audio signal by increasing or decreasing current that flows as part of the signal to the power amplifier 1246. The power amplifier 1246 amplifies the adjusted audio signal and provides the amplified audio signal to the printed circuit board terminals 1248 to be output to speakers (e.g., user-built speakers, such as a paper speaker or a cardboard speaker as described herein).

In addition, when a strobe control 1224 is switched "on," the microcontroller 1250 receives a strobe control signal from the strobe control 1224. In response to the strobe control signal, the microcontroller 1250 activates the strobe driver 1258. The strobe driver 1258 drives the strobe 1264 to generate a flashing light. A frequency of the flashing light may be determined based in part on the strobe control signal, a frequency of the audio signal, a frame rate of a camera, or any combination thereof.

It will thus be appreciated that an audio demonstration kit that includes the amplifier module 1120 of FIG. 11 or the amplifier module 1220 of FIG. 12 can be used to demonstrate scientific concepts, such as electricity, magnetism, transduction, sound, light frequency, and frame rate to a user. For example, the amplifier module 1120 can be used in conjunction with speakers to demonstrate how speakers translate electrical signals to sound (e.g., by causing the wire coil 212 to drive the paper speaker 402).

Referring to FIG. 16, a flowchart of a particular embodiment of a method 1300 of operation at an amplifier module is shown. In an illustrative embodiment, the amplifier module is the amplifier 320, the amplifier module 1120, or the amplifier module 1220.

The method 1300 includes receiving an input audio signal at an amplifier module of an audio demonstration kit, at 1302. The method 1300 also includes generating a first amplified audio signal based on the input audio signal, at 1304. The method further includes transmitting the first amplified audio signal to at least one speaker constructed from packaging of the audio demonstration kit, at 1306. For example, as shown in FIG. 15, the amplifier module 1220 receives the input audio signal (e.g., from an external audio device, such as a mobile phone or a tablet computer) and outputs amplified audio signals to one or more speakers (e.g., user-built speakers).

The method 1300 includes receiving a control signal at the amplifier module at 1308. For example, the control signal may correspond to a tone control or a volume control. The method also includes generating a second amplified audio signal according to the control signal, at 1310, and transmitting the second amplified audio signal to the at least one speaker, at 1312. For example, as shown in FIG. 15, the amplifier module 1220 can receive a tone control signal from the tone control 1228 and/or a volume control signal from the volume control 1226, and the amplifier module 1220 can adjust the amplified audio signal output to the speakers accordingly.

The method 1300 may thus enable an amplifier to adjust audio signals sent to user-built speakers such as speakers made out of packaging of an audio kit.

Referring to FIG. 17, a flowchart of another particular embodiment of a method 1400 of operation at an amplifier module is shown. In an illustrative embodiment, the amplifier module is the amplifier 320, the amplifier module 1120, or the amplifier module 1220.

The method 1400 includes receiving mode input at an amplifier module of an audio demonstration kit, at 1402. The amplifier module includes a first output and a second output. The amplifier module is also connected to a first cardboard speaker formed from a packaging of the audio demonstration kit and/or a second paper speaker having at least a diaphragm and a suspension collectively formed from a single sheet of paper. The method 1400 includes determining a mode indicated by the mode input, at 1403. The method 1400 also includes, when the mode input indicates a monaural mode, outputting audio signals via one but not both of the first and second outputs, at 1404. For example, when the first switch 330 indicates the monaural mode, the amplifier 320 delivers audio signals to one but not both of the output ports 334 and 336. When the mode input indicates a stereo mode, the method 1400 includes outputting audio signals via both the first and second outputs, at 1406. For example, when the first switch 330 indicates the stereo mode, the amplifier 320 delivers audio signals to both of the output ports 334 and 336.

Referring to FIG. 18, a flowchart of another particular embodiment of a method 1500 of operation at an amplifier module is shown. In an illustrative embodiment, the amplifier module is the amplifier 320, the amplifier module 1120, or the amplifier module 1220.

The method 1500 includes receiving mode input at an audio amplifier, at 1502. The method 1500 includes determining a mode indicated by the mode input, at 1503. The method 1500 also includes, when the mode input indicates a first mode, delivering an amplified audio signal to at least one of a left output or a right output of the audio amplifier, at 1504. For example, when the switch 332 indicates the first mode, the amplifier 320 delivers amplified audio signal(s) via one or more of the output ports 334 and 336.

When the mode input indicates a second mode, the method 1500 includes commutating current in a first and second coil respectively connected to the left and right output to drive at least one of a rotary motor or an oscillating element, at 1506. For example, when the switch 332 indicates the second mode, the amplifier 320 commutates current drive an oscillating element or a rotary motor, as described with reference to FIGS. 11A, 11B, and 11C.

Referring to FIG. 19, a particular embodiment of a method 1600 of actuating a motion element and synchronizing movement of the motion element to a video frame rate of a video recording device is shown. In an illustrative embodiment, the method 1600 is performed by an amplifier module, such as the amplifier 320, the amplifier module 1120, or the amplifier module 1220.

The method 1600 includes receiving mode input at a controller of an audio demonstration kit, at 1602. The controller is coupled to a tone generator (e.g., a speaker) and to a strobe light generator. The controller is configured to synchronize movement of a motion element to a video frame rate of a video recording device. The method 1600 also includes delivering a signal to the tone generator to actuate the motion element, at 1604. For example, the amplifier 320 may deliver a signal to the speaker 402, which causes the motion element 950 to move.

The method 1600 includes determining a mode indicated by the mode input, at 1605. The method 1600 further includes, when the mode input indicates a phase mode, operating the strobe light generator to cause the strobe light to flash in accordance with a particular phase, at 1606. When the mode input indicates a delta mode, the method 1600 includes operating the strobe light generator to cause the strobe light to flash at a particular frequency, at 1608.

It is noted that some figures herein depict audio demonstration kits prior to construction of various components (e.g., paper speakers), whereas other figures depict components after construction. This is for ease of explanation only and not to be considered limiting.

Those skilled in the art may make numerous uses and modifications of and departures from the specific apparatus and techniques disclosed herein without departing from the inventive concepts. For example, selected embodiments of audio demonstration kits in accordance with the present disclosure may include all, fewer, or different components than those described with reference to one or more of the preceding figures. The disclosed embodiments should be construed as embracing each and every novel feature and novel combination of features present in or possessed by the apparatus and techniques disclosed herein and limited only by the scope of the appended claims, and equivalents thereof.

The invention claimed is:
1. An audio amplifier comprising:
a first output and a second output;
a power amplifier configured to output at least one audio signal; and
a controller configured to operate the audio amplifier in a first mode and in a second mode, wherein when operating in the first mode, the at least one audio signal is delivered from the audio amplifier to a speaker via the first output, wherein the at least one audio signal comprises alternating current, and wherein when operating in the second mode, the audio signal is commutated to direct current and delivered to the first output or the second output to drive at least one of a rotary motor or an oscillating element coupled to a motion element.
2. The audio amplifier of claim 1, wherein the at least one audio signal delivered to the oscillating element includes a low frequency output from the audio amplifier.
3. The audio amplifier of claim 1, wherein the controller is further configured to control a frequency of flashing of a strobe light.
4. The audio amplifier of claim 3, further comprising the strobe light.
5. The audio amplifier of claim 1, wherein a first coil is connected to the first output and is located on a first plane.
6. The audio amplifier of claim 5, wherein a second coil is connected to the first output and is located on a second plane that is perpendicular to the first plane.
7. The audio amplifier of claim 6, wherein a magnet of the rotary motor is positioned such that the ends of the magnet rotate in close proximity to and in a common plane of the first and second coils.
8. The audio amplifier of claim 7, wherein in the second mode, the at least one audio signal is received by the first and second coils and causes the magnet to rotate.
9. The audio amplifier of claim 1, further comprising a switch configured to trigger switch operation in a monaural mode in which the at least one audio signal is delivered to one but not both of the first and second outputs.
10. The audio amplifier of claim 9, wherein the switch is further configured to trigger a stereo mode in which the at least one audio signal is output to both the first and second outputs.
11. The audio amplifier of claim 10, further comprising a control configured to switch between the monaural mode and the stereo mode.
12. The audio amplifier of claim 1, further comprising a control configured to switch between the first mode and the second mode.
13. A method comprising:
receiving a mode input at an audio amplifier;
when the mode input indicates a first mode, delivering an audio signal to a speaker via a first output of the audio amplifier, wherein the audio signal comprises alternating current;
when the mode input indicates a second mode, commutating the audio signal to direct current and selectively delivering the audio signal via the first output or a second output of the amplifier to at least one of a rotary motor or an oscillating element coupled to a motion element.
14. The method of claim 13, further comprising, when the mode input indicates the first mode, receiving an audio mode input at the audio amplifier.
15. The method of claim 14, further comprising, when the audio mode input indicates a monaural mode, delivering the amplified audio signal to one but not both of first and second outputs of the amplifier.
16. The method of claim 14, further comprising, when the audio mode input indicates a stereo mode, delivering the amplified audio signals to both the first and second outputs.
17. An audio demonstration kit comprising:
an audio amplifier comprising:
a first output and a second output;
a power amplifier configured to output an audio signal; and
a controller configured to operate the audio amplifier in a first mode and in a second mode,
wherein in the first mode, the audio signal is delivered to a speaker via the first output and comprises alternating current, and
wherein in the second mode, the audio signal is commutated to direct current and selectively delivered to the first output or the second output to drive at least one of a rotary motor or an oscillating element coupled to a motion element; and
a speaker kit comprising at least one speaker configured to be connected to the audio amplifier.
18. The audio demonstration kit of claim 17, wherein the controller is further configured to control a frequency of flashing of a strobe light.
19. The audio demonstration kit of claim 18, further comprising the strobe light.
20. The audio demonstration kit of claim 18, further comprising a switch configured to trigger switch operation in a monaural mode in which the amplified audio signal is delivered to one but not both of the first output and the second output.

* * * * *